United States Patent
Kim et al.

(10) Patent No.: US 9,946,816 B2
(45) Date of Patent: Apr. 17, 2018

(54) SYSTEM FOR VISUALIZING A THREE DIMENSIONAL (3D) MODEL AS PRINTED FROM A 3D PRINTER

(71) Applicant: Palo Alto Research Center Incorporated, Palo Alto, CA (US)

(72) Inventors: Walter Kim, San Francisco, CA (US); Tolga Kurtoglu, San Jose, CA (US); Saigopal Nelaturi, Palo Alto, CA (US); Arvind Rangarajan, Santa Clara, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 537 days.

(21) Appl. No.: 14/217,811

(22) Filed: Mar. 18, 2014

(65) Prior Publication Data
US 2015/0269289 A1    Sep. 24, 2015

(51) Int. Cl.
G06F 17/00    (2006.01)
G06F 17/50    (2006.01)
G06T 19/00    (2011.01)
G06T 17/00    (2006.01)

(52) U.S. Cl.
CPC .......... *G06F 17/5009* (2013.01); *G06T 17/00* (2013.01); *G06T 19/00* (2013.01); *G06T 2219/008* (2013.01)

(58) Field of Classification Search
CPC ..... G06F 17/5009; G06F 17/50; G06T 17/00; G06T 15/00
See application file for complete search history.

(56) References Cited

U.S. PATENT DOCUMENTS

| | | | | |
|---|---|---|---|---|
| 5,754,738 A | * | 5/1998 | Saucedo | G06F 17/50 706/11 |
| 5,781,446 A | * | 7/1998 | Wu | G06F 17/5072 716/122 |
| 5,876,550 A | | 3/1999 | Feygin | |
| 7,023,441 B2 | * | 4/2006 | Choi | G06F 17/30259 345/441 |
| 2002/0103555 A1 | * | 8/2002 | Wallace, Jr. | G06F 17/5036 700/95 |
| 2003/0120472 A1 | * | 6/2003 | Lind | G06F 17/5009 703/13 |
| 2006/0155418 A1 | | 7/2006 | Bradbury | |
| 2007/0273896 A1 | * | 11/2007 | Yamamura | H04N 1/00832 358/1.1 |
| 2009/0012640 A1 | | 1/2009 | Wu | |
| 2012/0105534 A1 | | 5/2012 | Boday | |

(Continued)

OTHER PUBLICATIONS

GCodeSimulator ("Mathias Dietz—GcodeSimulator (3D Print Simulator) for PC", YouTube video, uploaded Jun. 26, 2013, accessed Jul. 27, 2016, 4 screenshots).*

(Continued)

*Primary Examiner* — Omar Fernandez Rivas
*Assistant Examiner* — Justin C Mikowski
(74) *Attorney, Agent, or Firm* — Fay Sharpe LLP

(57) ABSTRACT

A system and a method visualize three dimensional (3D) printability of a 3D model. A 3D printing process of the 3D model is simulated to generate a layered 3D model describing the 3D model as printed. A visual rendering of the layered 3D model is generated, and the visual rendering of the layered 3D model is displayed on a display device.

20 Claims, 18 Drawing Sheets

(56) References Cited

U.S. PATENT DOCUMENTS

| | | | |
|---|---|---|---|
| 2012/0105903 A1* | 5/2012 | Pettis | G06F 3/12 |
| | | | 358/1.14 |
| 2012/0224755 A1 | 9/2012 | Wu | |
| 2013/0157013 A1 | 6/2013 | Huson | |
| 2013/0171431 A1 | 7/2013 | Swartz | |
| 2013/0230832 A1 | 9/2013 | Peters | |
| 2013/0297059 A1* | 11/2013 | Grifith | B29C 67/0088 |
| | | | 700/98 |
| 2014/0086780 A1* | 3/2014 | Miller | A61F 5/01 |
| | | | 419/1 |
| 2014/0117585 A1* | 5/2014 | Douglas | B29C 67/0055 |
| | | | 264/401 |
| 2015/0036174 A1* | 2/2015 | Pettis | G06F 3/1288 |
| | | | 358/1.15 |
| 2015/0066178 A1* | 3/2015 | Stava | B29C 67/0088 |
| | | | 700/98 |
| 2015/0079327 A1* | 3/2015 | Kautz | B29C 67/0088 |
| | | | 428/64.1 |
| 2015/0269282 A1 | 9/2015 | Nelaturi | |
| 2015/0269289 A1 | 9/2015 | Kim | |

OTHER PUBLICATIONS (H.J. Jee et al., A visual simulation technique for 3D printing, 2000, Elsevier Ltd., Advances in Engineering Software 31 (2000) 97-106).*

(Paul Calvert, Inkjet Printing for Materials and Devices, 2001, American Chemical Society, Chem. Mater. 2001, 13, 3299-3305).*

(Aleksey Golovinskiy et al., A Statistical Model for Synthesis of Detailed Facial Geometry, 2006, Association for Computing Machinery, Inc., 2006, 1025-1034).*

Paul M. Thompson, et. al., Mathematical/Computational Challenges in Creating Deformable and Probabilistic Atlases of the Human Brain, Human Brain Mapping 9:81-92(2000).*

Telea, A., and Jalba, A., 2011. "Voxel-based assessment of printability of 3d shapes". In Mathematical Morphology and Its Applications to Image and Signal Processing. Springer, pp. 393-404.

Stava, O., Vanek, J., Benes, B., Carr, N., and Měch, R., 2012. "Stress relief: improving structural strength of 3d printable objects". ACM Transactions on Graphics (TOG), 31(4), p. 48.

Luo, L., Baran, I., Rusinkiewicz, S., and Matusik, W., 2012. "Chopper: partitioning models into 3d-printable parts." ACM Trans. Graph., 31(6), p. 129.

Calì, J., Calian, D. A., Amati, C., Kleinberger, R., Steed, A., Kautz, J., and Weyrich, T., 2012. "3d-printing of non-assembly, articulated models". ACM Transactions on Graphics (TOG), 31(6), p. 130.

Prévost, R., Whiting, E., Lefebvre, S., and Sorkine-Hornung, O., 2013. "Make it stand: balancing shapes for 3d fabrication". ACM Transactions on Graphics (TOG), 32(4), p. 81.

Sigmund, O., 2007. "Morphology-based black and white filters for topology, optimization". Structural and Multidisciplinary Optimization, 33(4-5), pp. 401-424, Jan. 2007.

Nelaturi, S., 2011. "Configuration modeling". PhD thesis, University of Wisconsin.

Lozano-Perez, T., 1983. "Spatial planning: A configuration space approach". Computers, IEEE Transactions on, 100(2), pp. 108-120, Feb. 1983.

Lee, I.-K., Kim, M.-S., and Elber, G., 1998. "Polynomial/rational approximation of minkowski sum boundary curves". Graphical Models and Image Processing, 60(2), pp. 136-165.

Vermeer, P. J., 1994. "Medial axis transform to boundary representation conversion". PhD thesis, Purdue University, May 1994.

Ahn, Jae-Woo, Myung-Soo Kim, and Soon-Bum Lim. "Approximate general sweep boundary of a 2d curved object." CVGIP: Graphical Models and Image Processing, 55(2):98-128, 1993, vol. 55, No. 2.

Ahn, Sung-Hoon, Michael Montero, Dan Odell, Shad Roundy, and Paul K Wright. "Anisotropic material properties of fused deposition modeling abs." Rapid Prototyping Journal, 8(4):248-257, 2002.

Amenta, Nina and Marshall Bern. "Surface reconstruction by voronoi filtering." Discrete & Computational Geometry, 22(4):481-504, 1999.

Lee, In-Kwon, Myung-Soo Kim, and Gershon Elber. "Polynomial/rational approximation of minkowski sum boundary curves." Graphical Models and Image Processing, 60(2):136-165, 1998.

Nelaturi, Saigopal and Vadim Shapiro. "Solving inverse configuration space problems by adaptive sampling." Computer-Aided Design, 45(2):373-382, 2013.

Requicha, Aristides AG and Herbert B Voelcker. "Boolean operations in solid modeling: Boundary evaluation and merging algorithms." Proceedings of the IEEE, 73(1):30-44, 1985, Jan. 1994.

Amenta, Nina, Sunghee Choi, and Ravi Krishna Kolluri. "The power crust, unions of balls, and the medial axis transform." Computational Geometry, 19(2):127-153, 2001, Mar. 2001.

Blum, Harry et al. "A transformation for extracting new descriptors of shape." Models for the perception of speech and visual form, 19(5):362-380, 1967.

Choi, Hyeong In, Sung Woo Choi, Hwan Pyo Moon, and Nam-Sook Wee. "New algorithm for medial axis transform of plane domain." Graphical Models and Image Processing, 59(6):463-483, 1997, Jul. 1997.

Lee, Der-Tsai. "Medial axis transformation of a planar shape." Pattern Analysis and Machine Intelligence, IEEE Transactions on, (4):363-369, 1982, Jul. 1982.

U.S. Appl. No. 14/217,891, filed Mar. 18, 2014, by Nelaturi et al., entitled "Automated Design and Manufacturing Feedback for Three Dimensional (3D) Printability".

U.S. Appl. No. 14/217,854, filed Mar. 18, 2014, by Nelaturi et al., entitled "Automated Metrology and Model Correction for Three Dimensional (3D) Printability".

Brackett et al, Topology Optimization for Additive Manufacturing, Wolfson School of Mechanical and Manufacturing Engineering, Loughborough University, Aug. 2011.

Ju-Hsien Kao, "Process Planning for Additive/Subtractive Solid Freeform Fabrication Using Medial Axis Transform", Jun. 1999, Stanford University 1-173.

Alexandru Telea and Andrei Jalba, "Voxel-Based Assessment of Printability of 3D Shapes", Univesity of Groningen, The Netherlands, Springer-Verlag Berlin Heidelberg 2011, ISMM 2011, LNCS 6671, pp. 393-404, 2011.

\* cited by examiner

SYSTEM FOR VISUALIZING A THREE DIMENSIONAL (3D) MODEL AS PRINTED FROM A 3D PRINTER

BACKGROUND

The present application relates generally to design and manufacturing. It finds particular application in conjunction with three dimensional (3D) printing, and will be described with particular reference thereto. However, it is to be appreciated that the present application is also amenable to other like applications.

3D printing, also known as additive or layered manufacturing, is the process of building 3D solid shapes by accumulating material laid out in cross sectional layers. The printing process is driven by the controlled planar translation of a print head in stacked layers that determines the spatial accumulation of material. Depending on the process, the print head typically either deposits material (e.g., in fused deposition modeling (FDM)), cures powder by applying a focused laser (e.g., in selective laser sintering (SLS) and stereolithography (SLA)), sprays liquid binding onto particles (e.g., in inkjet printing), or applies some combination of these methods.

Over the last two decades, the quality and speed of 3D printers has improved, design software for 3D printers has improved, and the costs of 3D printers have fallen. Compared to conventional manufacturing, 3D printing now includes a more automated nature in the manufacturing process, and a higher range of complexity in parts that can be produced. These advantages have led to increased adoption by eclectic groups of users who are not just using 3D printed parts as prototypes, but also as final products in a wide variety of applications ranging from clothing and art to prosthetics and topologically optimized functional parts. Hence, the aesthetic qualities and visual properties of the output of a 3D printing process are increasingly important.

Unfortunately, the democratization of additive manufacturing coupled with the feasibility of producing complex geometries has led to the widespread but often erroneous belief among many users that any model that can be designed in a computer-aided design (CAD) system can be manufactured using a 3D printer. In reality, the quality of a printed model is sensitive to a combination of the chosen build orientation, material, and printer parameters. Poor understanding of how the printing parameters affect the printed model in relation to the original model often leads to failures that are only apparent after printing, even to experts. For example, a home 3D printer user will often have to print multiple attempts in order to get the desired output. As another example, service providers for 3D printed parts often have significant scrap from print failures that are a result of this poor understanding.

Printer resolution in the stacking direction dictates the deviation from the intended shape due to stair stepping artifacts in the build, and parameters such as the nozzle diameter in FDM or the beam width and/or offset in SLS influence the resolution of the smallest feature printable by the translating print head. Furthermore, the printed size of structures, such as thin walls, bridges, and spikes, affect the integrity of these structures. The printed size is also influenced by printer resolution. Hence, 3D printer manufacturers often recommend minimum material-specific sizes for these structures. The various resolutions and minimum size recommendations mentioned are unrelated to the numerical resolution chosen to triangulate solid models for representation in a stereolithography (STL) file format. This lack of coordination between the printer-related resolutions/minimum-sizes and the numerical resolutions of the STL file leads to the discrepancies between the final 3D printed object and the designed CAD model.

Users often attempt to manually predict and correct defects or deficiencies of printed parts relative to corresponding CAD models with design heuristics and rules. Predicting and correcting defects or deficiencies saves time, material, energy, and labor by not producing parts from designs with unexpected flaws that manifest themselves in the manufacturing process. However, the ability to manually predict and correct defects or deficiencies is becoming increasingly difficult as the number of printers, materials, and manufacturing services available grows.

Existing software solutions for previewing a 3D model (that is intended to be 3D printed) show the original 3D model without showing any differences that might occur due to the 3D printing process. No geometric differences are shown, and no simulation of the texture of the 3D printed object from the layered nature of the process is shown. Also, no realistic rendering of the material is shown. Typically, photos of example objects printed using specific 3D printers are available for reference, but no such photo may exist for the specific part the user intends to print.

Further, existing software to analyze and prepare models for 3D printing are often intended to accompany a specific printer (e.g. MAKERWARE for the MAKERBOT printer, OBJET STUDIO for the OBJET line of printers from STRATASYS) and typically enable some combination of model cleanup, build orientation optimization, and tool path generation. Sometimes, computational support is further provided to hollow and thicken models to minimize material wastage and reinforce thin walls.

Model cleanup refers to geometric processing of a 3D model (e.g., specified in the STL file format) to create watertight manifold shapes that do not possess duplicate vertices, self-intersections, and other types of geometric errors that can arise due to numerical problems during creation, and particularly during the process of converting the file format of the 3D model to the STL format accepted by most printers. After cleanup, models may then be analyzed to either automatically or manually select a build orientation. If chosen automatically, the software tries to find an orientation near the specified pose that minimizes the additional material required to support the model during the build. Subsequently the models are sent to a tool path generator that generates low-level G-code instructions to run the 3D printer.

In view of the foregoing, manufacturability analysis for 3D printing is typically restricted to preparing the model for printing. This analysis typically happens in prototyping shops (i.e., downstream from design engineering) or not at all. Such shops have expertise in various software tools that are bundled with 3D printers to perform optimizations or manual corrections to part geometries, such as fixing bad models, making minor design changes, etc. As mentioned earlier, these tools are machine specific, making it difficult for designers to access them. Hence, there is a need for more general design software that can predict and correct defects or deficiencies in models.

The present application provides new and improved methods and systems which improve on the above-referenced technique and address the above-referenced challenges.

INCORPORATION BY REFERENCE

U.S. patent application Ser. No. 14/217,854 for "AUTOMATED METROLOGY AND MODEL CORRECTION FOR THREE DIMENSIONAL (3D) PRINTABILITY", by Nelaturi et al., filed Mar. 18, 2014, U.S. patent application Ser. No. 14/217,891 for "AUTOMATED DESIGN AND MANUFACTURING FEEDBACK FOR THREE DIMENSIONAL (3D) PRINTABILITY", by Nelaturi et al., filed on Mar. 18, 2014 (now U.S. Pat. No. 9,747,394 issued on Aug. 29, 2017), Ahn et al. Anisotropic material properties of fused deposition modeling abs. Rapid Prototyping Journal, 8(4): 248-257, 2002, and Nelaturi. Configuration modeling. PhD thesis, UNIVERSITY OF WISCONSIN, 2011, are all incorporated herein by reference in their entirety.

BRIEF DESCRIPTION

In accordance with one aspect of the present application, a system for visualizing three dimensional (3D) printability of a 3D model is provided. The system includes at least one processor configured to simulate a 3D printing process of the 3D model to generate a layered 3D model describing the 3D model as printed. The at least one processor is further configured to generate a visual rendering of the layered 3D model, and display the visual rendering of the layered 3D model on a display device.

In accordance with another aspect of the present application, a method for visualizing 3D printability of a 3D model is provided. A 3D printing process of the 3D model is simulated by at least one processor to generate a layered 3D model describing the 3D model as printed. Further, a visual rendering of the layered 3D model is generated by the at least one processor, and the visual rendering of the layered 3D model is displayed on a display device by the at least one processor.

In accordance with another aspect of the present application, a system for visualizing 3D printability of a 3D model is provided. The system includes at least one processor configured to simulate a 3D printing process of the 3D model to generate a layered 3D model describing the 3D model as printed The at least one processor is further configured to select a material shader for a print material selected by a user and generate a displacement map mapped to a surface of the layered 3D model from a shape of a segment of 3D printed material generated according to the 3D printing process. Even more, the at least one processor is configured to generate a visual rendering of the layered 3D model with the displacement map and the material shader and display the visual rendering of the layered 3D model on a display device.

In accordance with another aspect of the present application, a system for visualizing 3D printability of a 3D model is provided. The system includes at least one processor configured to receive or generate slices of the 3D model. The slices represent two dimensional (2D) solids of the 3D model to be printed in corresponding print layers. The at least one processor is further configured to simulate printing of the slices to identify corresponding printable slices and to combine the printable slices into a layered 3D model describing the 3D model as printed.

DETAILED DESCRIPTION

The present application describes a system to perform design evaluation for three dimensional (3D) printing using manufacturing simulation and to provide feedback prior to printing a 3D solid model. The system evaluates process plans by rapidly analyzing the solid and simulating the layered manufacturing process to identify expected deviations from the intended design. Parameters for the simulation may be tuned based on process and printer specific values. The result of the simulation provides interactive visual feedback that highlights regions that are expected to deviate from design intent, either in appearance or in structural integrity.

Further, the present application describes a system to perform automated metrology and model correction for 3D printability. Using techniques from mathematical morphology, printability in terms of local size measurements is determined and used to partition the 3D model into regions that can be manufactured up to specified resolutions. Local size is defined in terms of the medial axis transform and used to automatically identify regions that require a differential addition of material to ensure manufacturability, such as, but not limited to, at regions such as thin walls, bridges, protrusions, and holes. Topological consistency between the parts before and after manufacture is also maintained.

The present application also describes a system to visually render a 3D model as it would appear if printed with a 3D printing process. To determine the rendering, the user specifies the material to be used in the 3D printing process and the parameters of the 3D printing process, either by specifying the 3D printer to be used or by directly specifying the 3D printing process type, the layer thickness, and the relevant parameters defining the size and shape of the minimum feature (e.g., the nozzle or laser beam diameter). The material and parameters are then used to simulate the 3D printing process to determine the appearance of the 3D model after printing.

Figure 1:
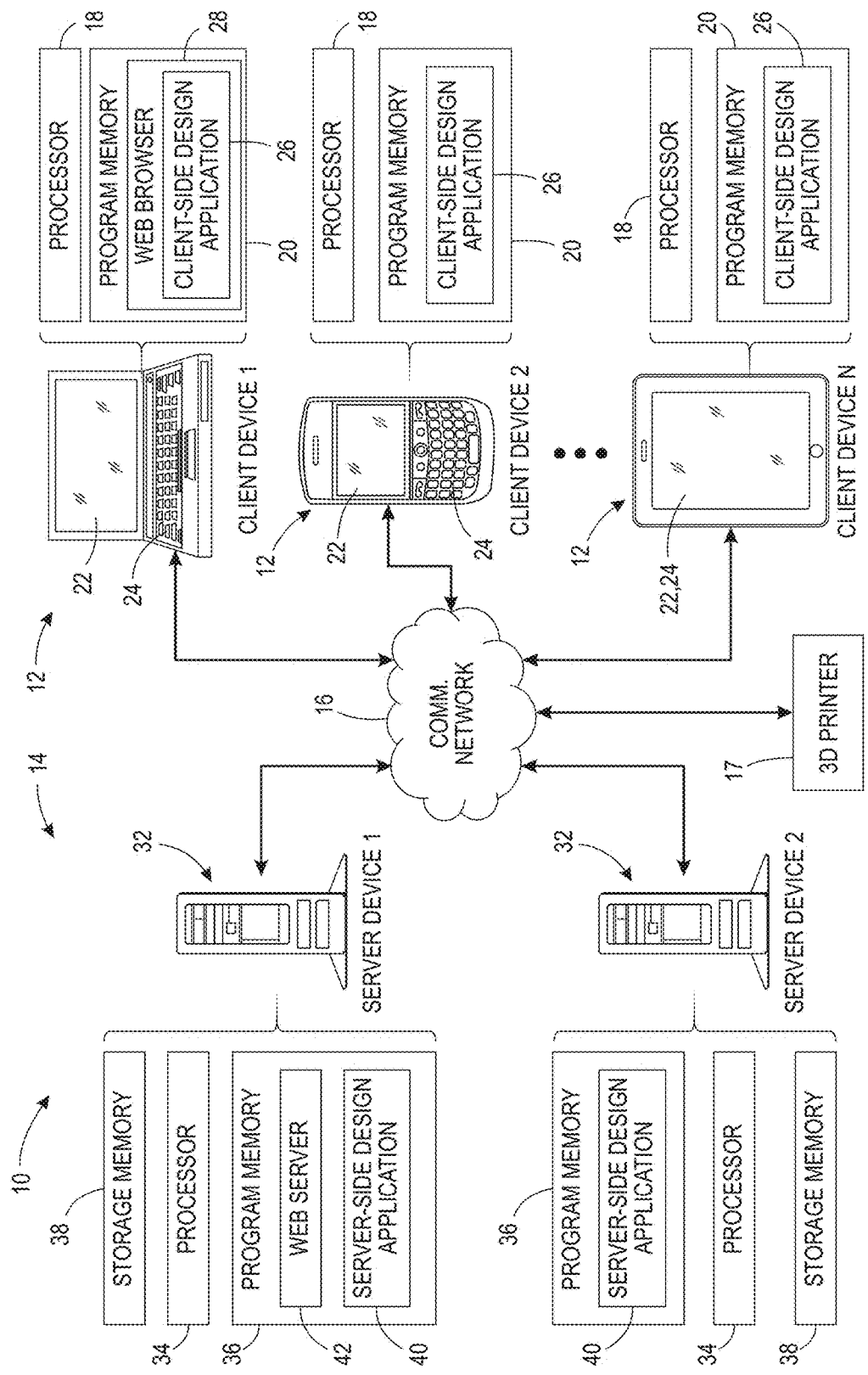
FIG. 1 illustrates a design system for interactive analysis and preparation of a three dimensional (3D) model for 3D printing.

With reference to FIG. 1, a design system 10 for interactive analysis and preparation of a 3D model for 3D printing is provided. The system 10 includes one or more client devices 12 communicating with a design service 14 over a communications network 16. The communications network 16 is typically the Internet, but can be any communications network, such as a local area network or a wide area network. While the design system 10 is not dependent on any specific printer, the system 10 can further include a 3D printer 17 connected to the communications network 16 for printing the 3D model. The 3D printer 17 can print the 3D model by any 3D printing process, such as fused deposition modeling (FDM).

Each client device 12 includes at least one processor 18, at least one program memory 20, a display device 22 and a user input device 24. The at least one processor 18 executes processor executable instructions stored in the at least one program memory 20 to provide a user with a graphical user interface (GUI) with the display device 22 and the user input device 24. The processor executable instructions include a client-side design application 26 for client side functionality of the design system 10, discussed hereafter. The client-side design application 26 can be a standalone application or a web application. Where the client-side design application 26 is a web application, the client-side design application 26 is executed within a web browser 28 of the processor executable instructions. The client devices 12 are typically portable devices, such as smartphones, laptops, or tablet computers, but other devices, such as desktop computers, are amenable.

Figure 2:
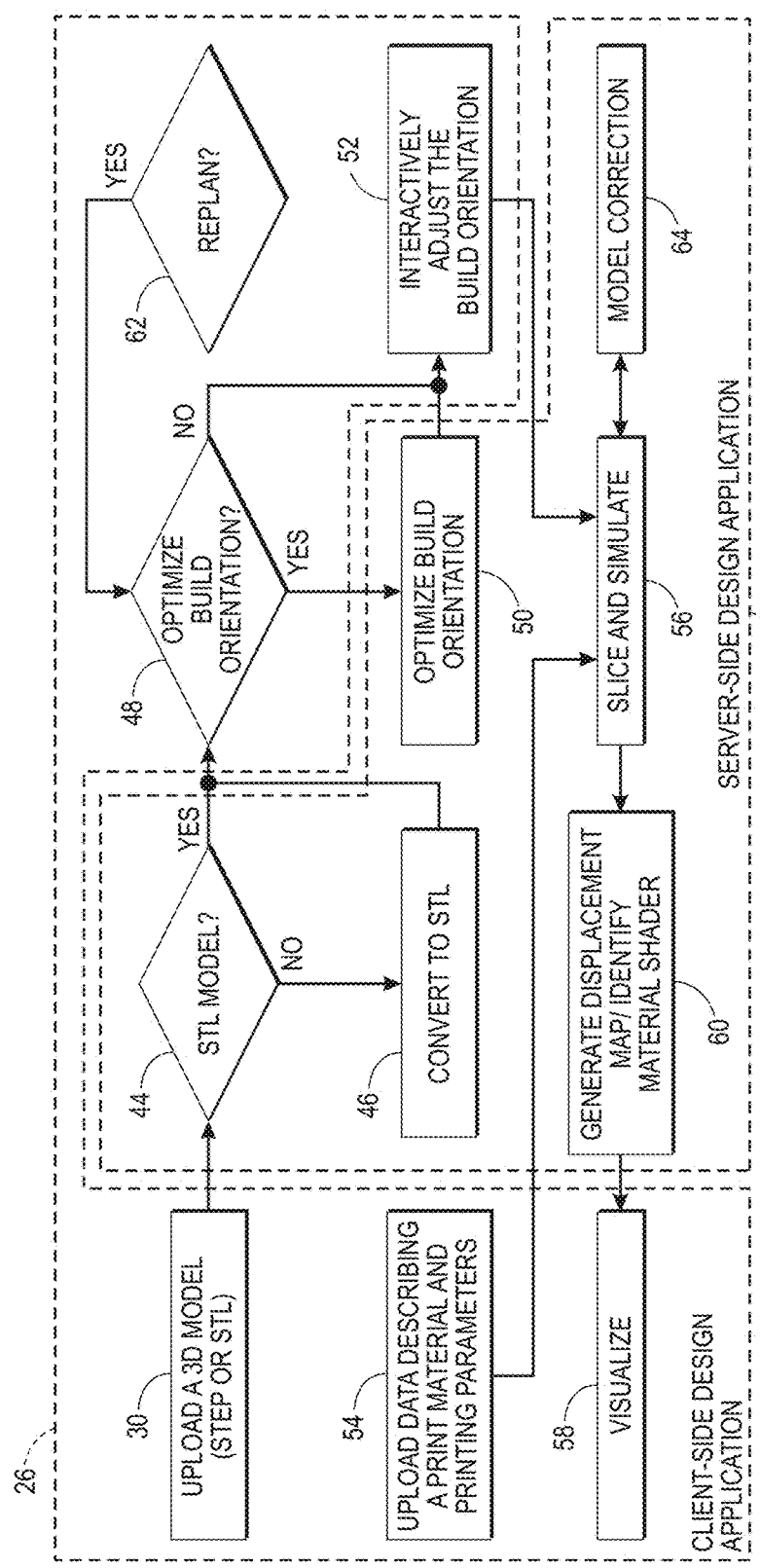
FIG. 2 illustrates a flow chart of the operation of the design system of FIG. 1.

With reference to the flow chart of FIG. 2, when a user initializes the client-side design application 26 on the client device 12 corresponding to the user, the user uses the client-side design application 26 to upload 30 a 3D model to the design service 14 over the communications network 16. The 3D model is, in one embodiment, generated using a computer-aided design (CAD) software tool. Further, the 3D model is, in one embodiment, formatted in a stereolithography (STL) file format or a standard for the exchange of product model data (STEP) file format. Other formats are, however, contemplated.

Referring back to FIG. 1, the design service 14 includes one or more server devices 32 including at least one processor 34, at least one program memory 36, and at least one storage memory 38. The at least one processor 34 executes processor executable instructions stored in the at least one program memory 36. The processor executable instructions include a server-side design application 40 for server side functionality of the design system 10, discussed hereafter. In some embodiments, execution of the server-side design application 40 (i.e., the corresponding computations) is distributed across multiple processors in a distributed network. The at least one storage memory 38 stores data uploaded to the design service 14 by the client devices 12. The one or more server devices 32 are typically one or more computer servers, but one or more application specific devices are additionally or alternatively contemplated.

In some embodiments, where the client-side design application 26 is a web application, at least one of the server devices 32 stores the client-side design application 26 in the at least one storage memory 38. Further, the at least one program memory 36 includes processor executable instructions embodying a web server 42. The at least one processor 34 then executes the processor executable instructions embodying the web server 42 to provide the client-side design application 26 stored in the at least one storage memory 38 to the client devices 12 as a web application.

Referring back to FIG. 2, the server-side design application 40 receives the 3D model uploaded by the user and determines 44 the file format of the 3D model. If the 3D model is formatted in anything other than an STL file format, the 3D model is converted 46 to an STL file format. For example, if the 3D model is formatted in a STEP file format, the 3D model is converted to an STL file format.

With the 3D model in an STL file format, a determination 48 is made as to whether the build orientation of the 3D model should be optimized. In some instances, this is automatically determined from predefined preferences of the user. Alternatively, the user is prompted to identify whether the build orientation of the 3D model should be optimized through cooperation with the client-side design application 26. If it is determined that the build orientation of the 3D model should be optimized, the server-side design application 40 optimizes 50 the build orientation of the 3D model. Otherwise the user may interactively choose the orientation in which the model should be printed.

Choosing build orientation amounts to a central planning problem for 3D printing, which can directly influence the build quality and subsequent structural integrity of the 3D model. For example, in a FDM process where a nozzle head extrudes a plastic filament, additional material must be printed on the part to support overhangs and other features that can cause warping or accessibility issues. This creates a planning problem where it is important to print the 3D model in an orientation where the amount of support material is minimized, while avoiding supports on functional or aesthetic surfaces. It is often possible to print the 3D model in multiple orientations with substantially different material properties. The planning problem extends to a situation where multiple discrete components are printed in a single printer workspace and where the components need to be packed in a manner that optimizes the build quality of each component.

The build orientation can be optimized using an algorithm that searches the space of orientations to optimize (e.g., minimize or maximize) an objective function. Typically, the objective is to minimize the amount of support material on surfaces of the 3D model that are not marked as functional or aesthetic by the user. However, any objective related to build orientation, such as minimizing the volume of the support material or minimizing the volume of regions below printer resolution, can be employed. The markings can be included with the 3D model or obtained through coordination with the client-side design application 26. As to the latter, the client-side design application 26 can, for example, be employed to display the 3D model to the user, receive user input marking regions of the displayed 3D model, and relay the user input to the server-side design application 40.

Figure 3:
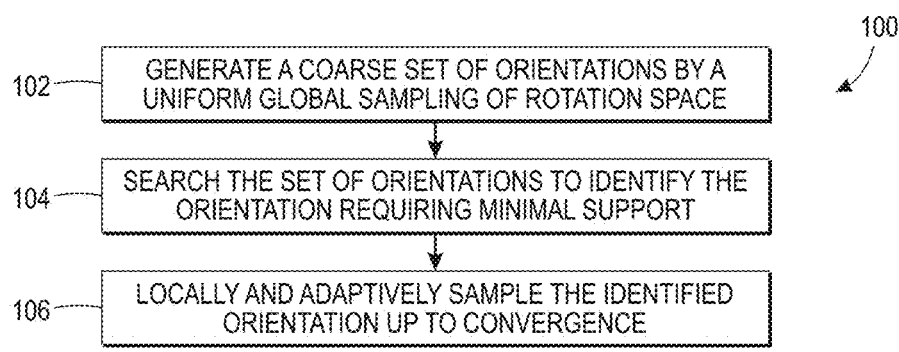
FIG. 3 illustrates a method for optimizing build orientation of a 3D model.

With reference to FIG. 3, an algorithm (or method) 100 that searches the space of orientations of the 3D model to optimize an objective function is provided. As discussed in greater detail hereafter, the algorithm 100 globally and adaptively searches the rotation space of the 3D model.

According to the algorithm 100, an initial coarse set of orientations is generated 102 by a uniform global sampling of the 3D rotation space. The set of orientations is then searched 104 to optimize an objective function and find the best orientation of the set. For example, the search can be for a minimum value of an objective function, which returns, as a function of orientation, surface area of contact with support material on surfaces of the 3D model that are not marked as functional or aesthetic, and the search can return the orientation associated with the minimum value. The amount of support material can be calculated using any approach that identifies the visible surfaces to be supported, and covers that surface with support material, printed from the ground up. In some embodiments, the amount of support is calculated according to a well-known heuristic adopted in 3D printing where support material is provided for any facet with an overhang greater than 45 degrees with respect to the build orientation. See, for example, Ahn et al. Anisotropic material properties of fused deposition modeling abs. *Rapid Prototyping Journal*, 8(4):248-257, 2002.

After searching the set, the best orientation is locally and adaptively sampled 106 using the properties of the configuration product on the group of three dimensional rotations SO(3) up to convergence defined by relative changes in the objective function. For example, where the objective is to minimize the support material on surfaces of the part that are not marked as functional or aesthetic, the best orientation is locally and adaptively sampled until the objective function converges at a value. See, e.g., Nelaturi. *Configuration modeling*. PhD thesis, UNIVERSITY OF WISCONSIN, 2011.

Referring back to FIG. 2, the user is next given the option to interactively adjust 52 the build orientation. This is performed regardless of whether the build orientation is optimized. The user can interactively adjust the build orientation through coordination with the client-side design application 26. By way of the client-side design application 26, the user is displayed a virtual representation of the printer workspace with the 3D model oriented within the virtual representation and the support material arranged around the 3D model in the virtual representation. The user then manipulates the orientation of the 3D model with a user input device 24 and the adjusted build orientation is relayed to the server-side design application 40.

Figure 4A:
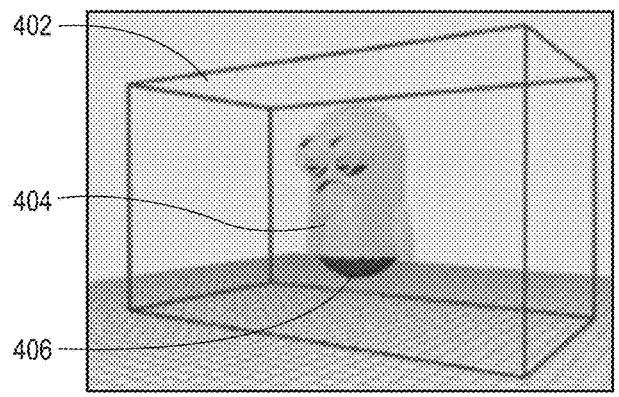
FIG. 4A illustrates a virtual representation of a printer workspace with a 3D model displayed according to its build orientation and with regions requiring support material displayed on the 3D model.
Figure 4B:
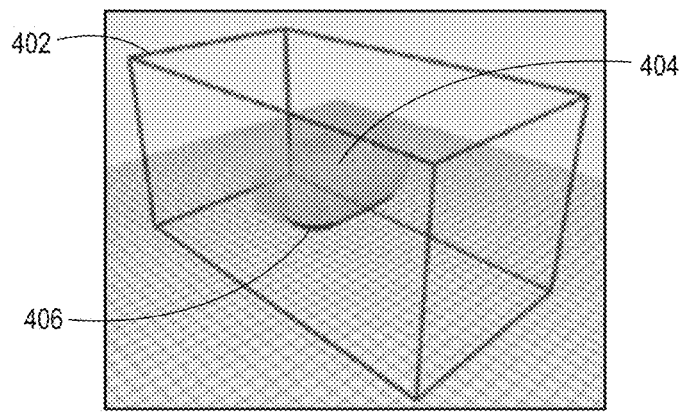
FIG. 4B illustrates the 3D model of FIG. 4A, with updated regions requiring support material, after a user interactively adjusts the build orientation of the 3D model.

With reference to FIGS. 4A and 4B, a virtual representation 402 of a printer workspace is illustrated with a 3D model 404 and support regions 406 for the 3D model 404.

FIG. 4A illustrates the 3D model 404 oriented in a first build orientation, and FIG. 4B illustrates the 3D model 404 orientated in a second build orientation. The 3D model 404 was orientated according to the first build orientation by the optimization algorithm, and reoriented according to the second build orientation by the user.

Referring back to FIG. 2, in addition to using the client-side design application 26 to upload the 3D model to the design service 14, the user uses the client-side design application 26 to generate and upload 54 configuration data describing the print material and parameters of the 3D printing process, such as layer thickness, process type (e.g., FDM or selective laser sintering (SLS)), and the size of the smallest printable feature (e.g., nozzle diameter for FDM or laser diameter for SLS). The parameter data can be generated by, for example, user selection of a 3D printer from a list of 3D printers supported by the design service 14. Each 3D printer of the list is associated with parameter values. Further, the print material data can be generated by, for example, user selection of a print material from a list of materials supported by 3D printers or the selected 3D printer. The generated configuration data is then uploaded to the design service 14 over the communications network 16.

The server-side design application 40 receives the configuration data uploaded by the user and slices 56 the 3D model into a plurality of slices along the build orientation. A slice is the intersection of a plane, translated along the build orientation, with the 3D model oriented according to the build orientation, and represents the two dimensional solid to be printed in a layer. Each slice is determined by intersecting a two dimensional (2D) plane having a normal parallel to the build orientation at the height of the corresponding print layer. The number of such slices is equal to the height of the 3D model divided by the layer thickness of the 3D printing process, and the distance between subsequent slices is equal to the layer thickness. The parameters pertaining to the 3D printing process, such as the layer thickness, are determined from the configuration data.

Subsequent to or concurrent with slicing the 3D model, the slices are regularized. A regularized slice is the topological closure of the interior of a slice. Regularization of a slice can be performed through application of Boolean operations to the slice to automatically merge disjoint but overlapping components in the slice. Overlapping components create non-manifold points, which are known to cause problems while simulating tool paths (discussed below) because it is difficult to distinguish points inside and outside the slice. The result of the merging gives a set of regularized planar solids or regions (in the most general case) for the slice, where each solid is bounded by a polygon and has a well-defined interior.

The interior of each of the regularized slices is next partitioned into disjoint sets of regions that constitute a printability map. Typically, the printability map for a regularized slice includes three disjoint sets of weakly printable, strongly printable, and unprintable regions, discussed hereafter, but more or less disjoint sets are amenable.

A region unable to contain the smallest printable feature is unprintable. Such a region is so small that it may be covered by excessive print material if printing is attempted, or other unexpected results may occur. The smallest printable feature is determined from the configuration data. The unprintable regions of the regularized slice constitute a first set T of the printability map.

A region where a smallest printable feature is completely contained within the slice, and where every point of the region on the boundary of the regularized slice has a local feature size higher than the recommended size for the print material, is strongly printable. The print material is determined from the uploaded configuration data. The local feature size at a location x on the boundary of the regularized slice is defined by the shortest distance from x to the medial axis of the regularized slice. The medial axis of the regularized slice is the set of all points having more than one closest point on the boundary of the regularized slice. The strongly printable regions of the regularized slice constitute the second set G of the printability map.

A region where a smallest printable feature is completely contained within the slice, but where any point of the region on the boundary of the regularized slice has a local feature size lower than the recommended feature size for the print material, is weakly printable. Such a region is prone to structural failure due to the thin or flimsy nature of the region. The weakly printable regions of the regularized slice constitute the third set F of the printability map.

In some instances, the printability map includes a set of user-defined regions. A user-defined region is a region where any point of the region on the boundary of the regularized slice has a local feature size greater than a user-defined local feature size. The user-defined local feature size can be included in the configuration parameters. In this way, the user can define a minimum feature size and identify the set of regions of the regularized slice that are able to accommodate this minimum feature size.

A printability map for a regularized slice is generated by simulating 56 the layered manufacturing of the slice by tracing the motion of a feature model of the smallest printable feature as a translating print head attempts to print the slice. In one embodiment, the simulated layered manufacturing process is FDM, but other layered manufacturing processes, such SLS, can also be simulated. The feature model includes both the shape and size of the smallest printable feature and is typically a circular disc. For example, where the layered manufacturing process is FDM, the circular disc represents the cross section of print material extruded through a nozzle. As another example, where the layered manufacturing process is SLS, the circular disc represents the cross section of the laser beam fusing print material. The shape and size of the feature model is determined from the configuration data (e.g., using print resolution).

The tracing can be done with or without tool paths. A tool path is the path that the translating print head follows while attempting to print a slice. Where a tool path is unavailable and the feature model is a circular disc $B_d$ with a diameter d, the tracing is performed by using morphological operations, in particular the opening and white-hat transform.

Unlike conventional approaches to computing morphological operations that require the specification of a 2D or 3D image to compute the morphological operations, modeling the smallest printable feature with a circular disc allows computations to be directly formulated on polygons that define the boundary of a slice. There are two aspects of directly computing the morphological operations on polygons. First, using the slice boundary ensures the representation of the 3D model is not altered, whereas using image processing operations requires the rasterization (i.e., sampling) of the solid into points on the image, which inherently induces discretization error in the printability map. Second, the opening can be expressed as a composition of an inward and outward polygon offset that will automatically capture rounded corners, and the white-hat transform, which is the set difference between the polygon and its opening, which will capture the low resolution regions of the model. These offset and subtraction operations can be efficiently and robustly computed in the plane to give an accurate simulation of the feature model.

To compute the set of unprintable regions T, the white hat transform $T=S-\delta(\epsilon(S,B_d),B_d)$ of the set of regularized planar solids S in the slice is computed (again $B_d$ being a circular disc with a diameter d). $\delta(X,Y)$ and $\epsilon(X,Y)$ represent the dilation and erosion, respectively, of a set X by a set Y. The set of regions S−T represents regions whose local feature size is above the printer resolution (i.e., the set of strongly and weakly printable regions). This set can further be partitioned into two disjoint sets $F=(S-T)-\delta(\epsilon(S-T),B_f),B_f)$ and $G=S-T-F$. $B_f$ represents a circular disc with a diameter being the minimum recommended feature size for the print material. Therefore, F represents the set of weakly printable regions, G represents the set of strongly printable regions, and the printability map can be represented by the disjoint sets of T, F, and G.

The polygon offsetting approach described above frees the printability map computation from resolution dependent problems associated with image based approaches. However, despite freeing the printability map computation from resolution dependent problems, the polygon approach is limited in that the feature model being circular. If the feature model is a shape other than a circular disc (e.g., an ellipse to accurately represent flattened filaments in printers with very high resolution), the printability map is computed best in terms of image based morphological operations. With traditional algorithms, the efficiency of the computations significantly reduces with the complexity of the feature model because traditional computations operate in a pixel-pairwise fashion and this quadratic complexity cannot be avoided in the general case.

To trace the motion of a non-circular feature model, fast algorithms using convolutions of binary images and the correspondence to mathematical morphology are typically used to effectively outline the printability map. The highest level set of the convolution of the indicator functions gives the morphological erosion of the polygon by the feature model. Effectively, the erosion outlines the path traced by the feature model along a space-filling curve, while remaining within the slice boundary.

Figure 5A:
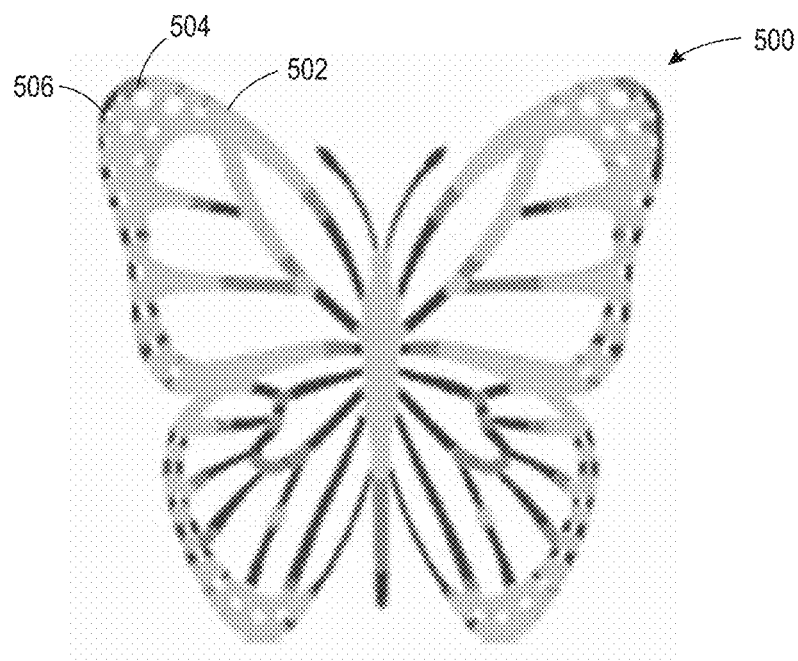
FIG. 5A illustrates a printability map of a slice computed using a circular feature model.
Figure 5B:
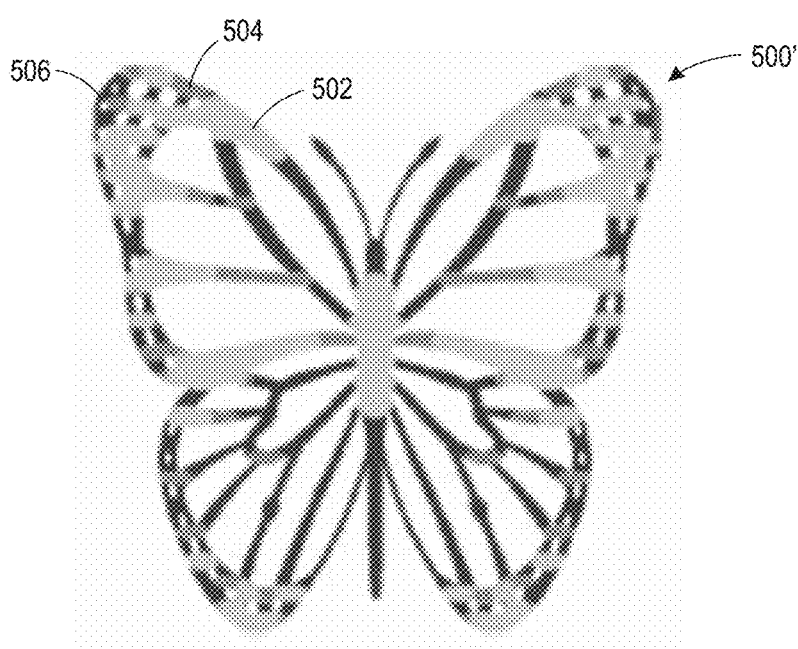
FIG. 5B illustrates a printability map of the slice of FIG. 5A computed using an elliptical feature model.

After computing the white hat transform on an image representation of the slice to identify the set of unprintable regions T in the printability map, an iso-surface extraction algorithm, such as marching squares, is used to extract a polygonal representation of the set of unprintable regions T. With the polygon representation, the sets of regions F and G in the printability map are computed in the same manner described above (i.e., using the circular disc $B_f$). Alternatively, the sets of regions F and G are computed on the image representation and converted to polygonal representations using the iso-surface extraction algorithm. FIGS. 5A and 5B illustrate a comparison between printability maps 500, 500' generated using circular and elliptical feature models, respectively. Strongly printable regions 502, weakly printable regions 504, and unprintable regions 506 are color coded.

Where a tool path is available, the tool path can be explicitly or implicitly defined. If the tool path is implicitly defined, the tool path is reconstructed to explicitly define the tool path. For example, where the tool path is formatted in G-code, the tool path is reconstructed by linearly interpolating poses of the print head specified in G-code. With the explicit tool path, a printable slice (i.e., the set of strongly and weakly printable regions F+G) is determined as the well-known Minkowski sum of the feature model and the tool path. In other words, the feature model is traced along the tool path to determine the resulting shape. The Minkowski sum can be calculated as a morphological dilation or as the zero level set of the convolution of the indicator function of the two shapes.

Figure 6A:
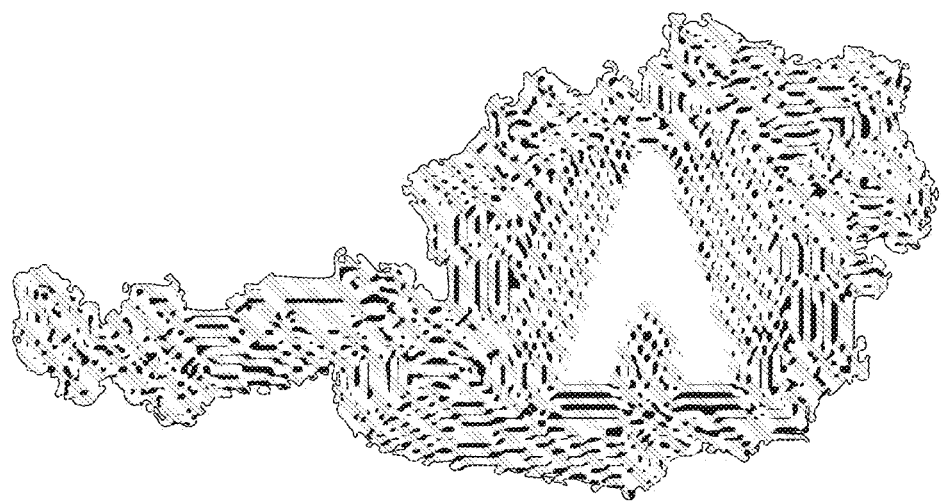
FIG. 6A illustrate a tool path for a shape of Austria.
Figure 6B:
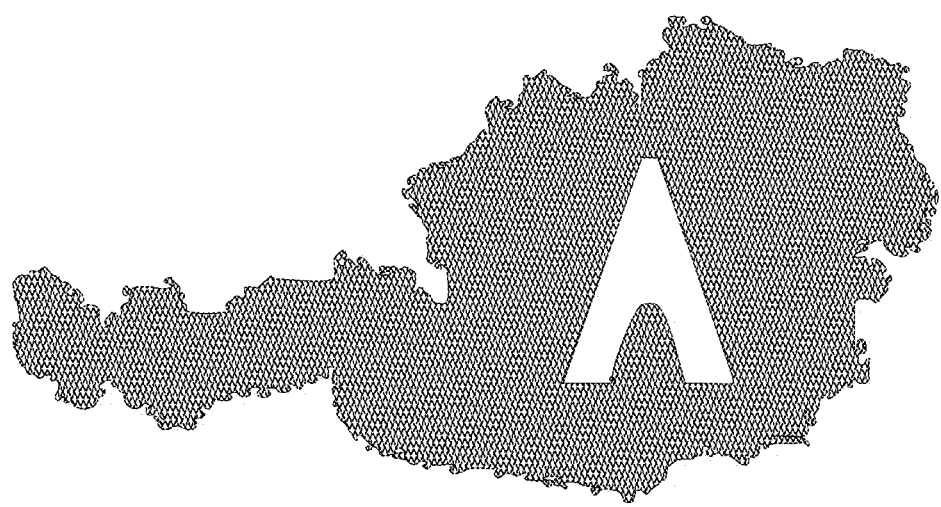
FIG. 6B illustrates a Minkowski sum generated using the tool path of FIG. 6A.

As above, the morphological operations can be performed in the polygon domain or the image domain. Further, the latter requires converting the boundary of the printable slice to the polygon domain. A standard marching squares algorithm with well-known cleanup and post processing can be used to convert the printable slice to the polygon domain. FIG. 6B illustrates a Minkowski sum of Austria (country) generated using the tool path of FIG. 6A.

Figure 7A:
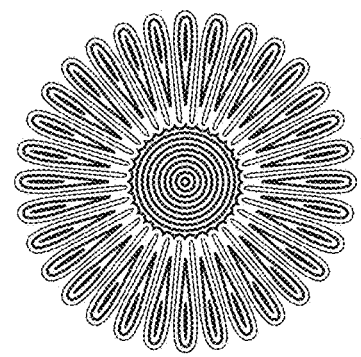
FIG. 7A illustrates a tool path for a floral shape.
Figure 7B:
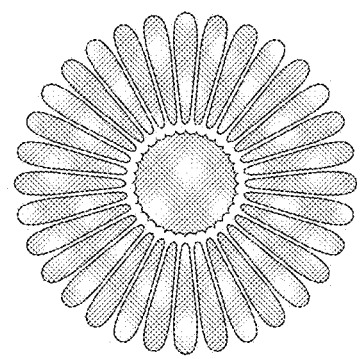
FIG. 7B illustrates a Minkowski sum generated using the tool path of FIG. 7A.
Figure 7C:
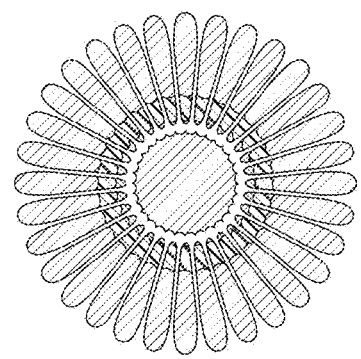
FIG. 7C illustrates a printability map of the floral shape of FIG. 7A.

The printable slice is formed by the sets of printable regions of the regularized slice (i.e., the sets of strongly and weakly printable regions). The unprintable regions can be determined by taking the difference between the regularized and the printable slices. Furthermore, to distinguish between the strongly and weakly printable regions, the same approach as defined earlier is employed by computing a white hat transform of the printable slice with a disc having a diameter equal to the minimum recommended feature size. As above, the sets of different region types collectively define the printability map. FIGS. 7A-C illustrates the print simulation of a floral shape. FIG. 7A corresponds to a tool path of the floral shape, FIG. 7B corresponds to a Minkowski sum of the floral shape, and FIG. 7C corresponds to a printability of the floral shape.

Figure 8:
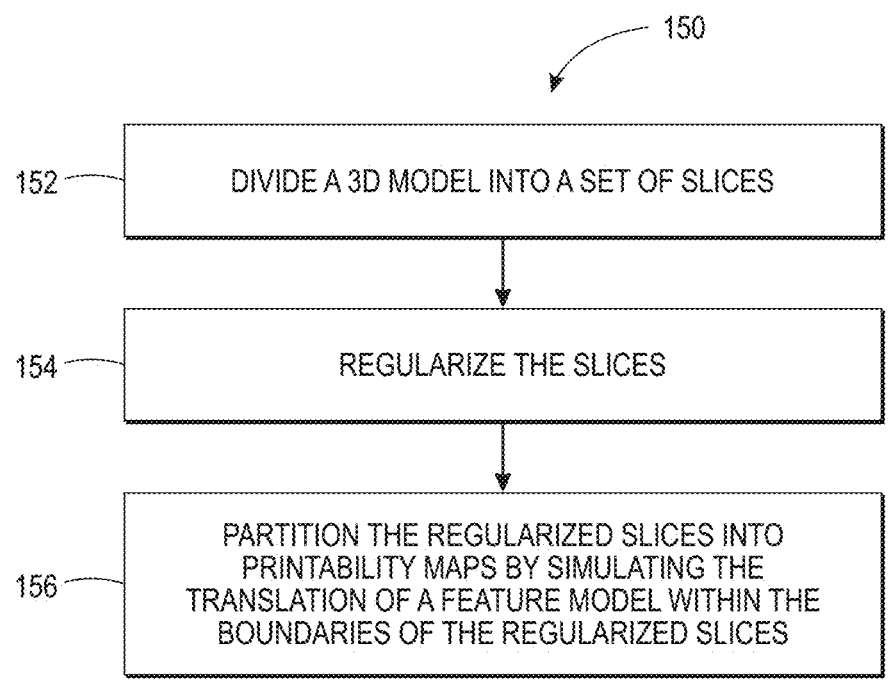
FIG. 8 illustrates a method for generating a printability map.

With reference to FIG. 8, a method 150 summarizes the approach to generating the printability maps. According to the method 150, a 3D model is divided 152 into a set of slices. The slices are then regularized 154 and partitioned 156 into printability maps by simulating the translation of a print head within the boundaries of the regularized slices. The translation for a slice can be performed without a user-defined tool path, but it can also be performed along such a tool path. The simulation identifies the printable region of each of the regularized slice. In some embodiments, the method 150 is performed in parallel by a plurality of processors, which simultaneously simulate the printing of the slices in parallel. The plurality of processors can be distributed over a distributed computing network, including, for example, servers with multiple processor cores. In this way, the computations can be distributed across servers, and across cores per server.

Referring back to FIG. 2, using the printability maps, a layer model is generated from the printability maps. This includes determining a 3D layer for each of the printability maps by selecting a set of regions (e.g., the set of F+G) of the printability map and extruding the regions of the set in the print direction by a distance equal to the layer thickness of the printing process. The layer thickness can be determined from the configuration data. The 3D layers are then combined into the layered model, where each layer is placed at its corresponding height.

Once the layered model is generated, the layered model can be provided to the client-side design application 26 over the communications network 16 and displayed to the user by the client-side design application 26. The client-side design application 26 can visualize 58 the layered model by passing the layered model to a graphics rendering pipeline, such as OPENGL or DIRECTX. The user can then manipulate the visualization with a user input device 24. For example, the user can change the viewpoint of the layered model, zoom, pan, or translate the layered model.

In some embodiments, the user can select which types of regions (i.e., strongly printable, weakly printable, and unprintable) of the printability map to include within the layered model by way of the client-side design application 26. Where the user selects to include only the set of F+G, the layered model represents the as-manufactured model. The as-manufactured model can optionally be displayed with surfaces thereof that vary from the 3D model highlighted (e.g., in red). Further, in some embodiments, the different types of regions included within the layered model can be uniquely displayed. For example, strongly printable regions can be displayed as green, weakly printable regions can be displayed as orange, and unprintable regions can be displayed as red.

Figure 9A:
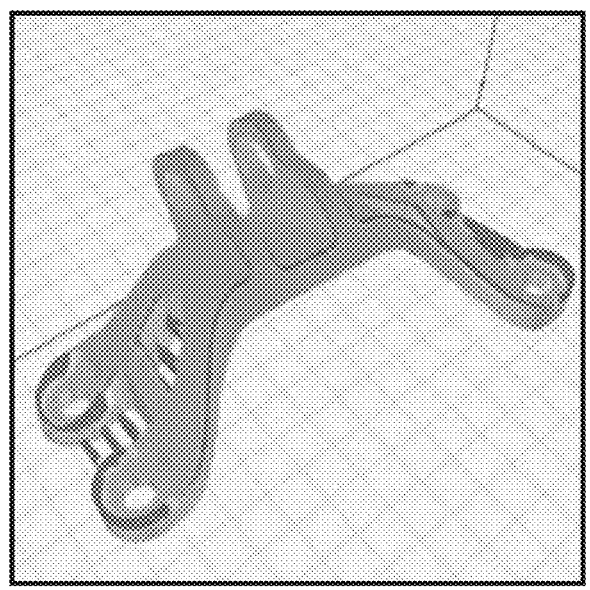
FIG. 9A illustrates a zoomed-out rendering of a layered model displayed to a user.
Figure 9B:
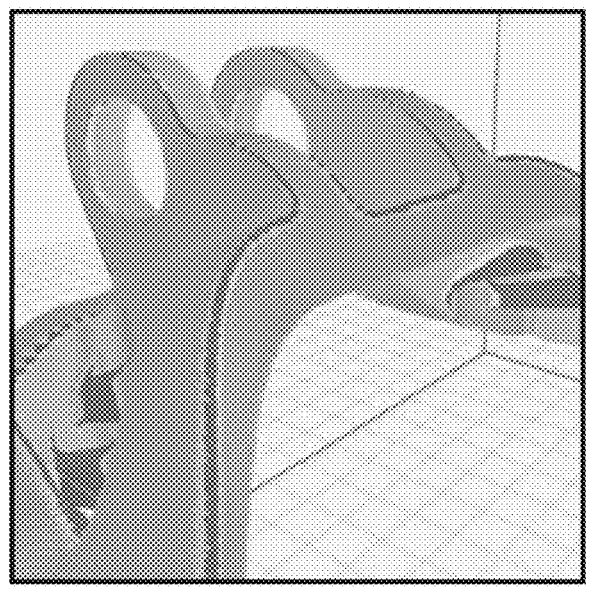
FIG. 9B illustrates a zoomed-in rendering of the layered model of FIG. 9A.

With reference to FIGS. 9A and 9B, the displayed rendering of a layered model is illustrated. The layered model is generated with unprintable regions and displayed with color coding to allow the user to identify defects in the 3D model. FIG. 9A illustrates a zoomed-out view of the layered model, and FIG. 9B illustrates a zoomed-in view of the layered model. As can be more readily seen in FIG. 9B, the layered model is constructed from layers.

Referring back to FIG. 2, although not necessary, in order to simulate more subtle artifacts of the layered printing process without having to introduce higher complexity into the mesh of the layered model, a per-pixel displacement map can be generated 60 and provided to the client-side design application 26 over the communications network 16. The client-side design application 26 can then employ the displacement map to visualize the layered model with micro detail.

Figure 10A:
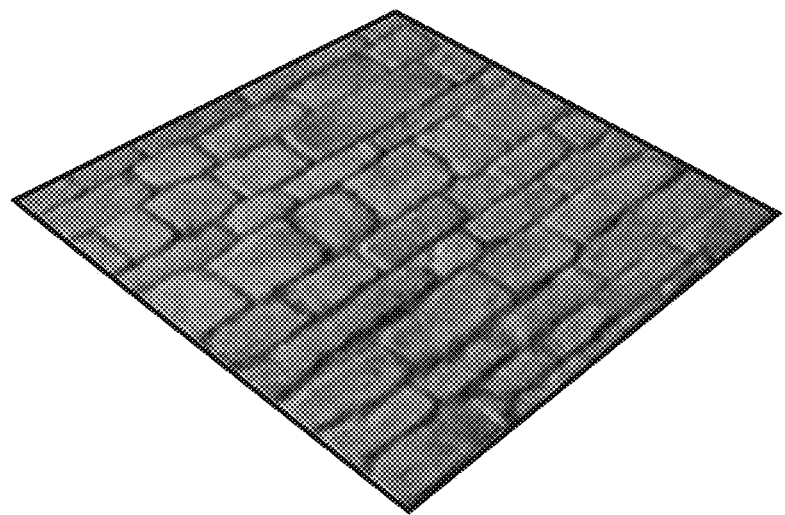
FIG. 10A illustrates the rendering of a model without a displacement map.
Figure 10B:
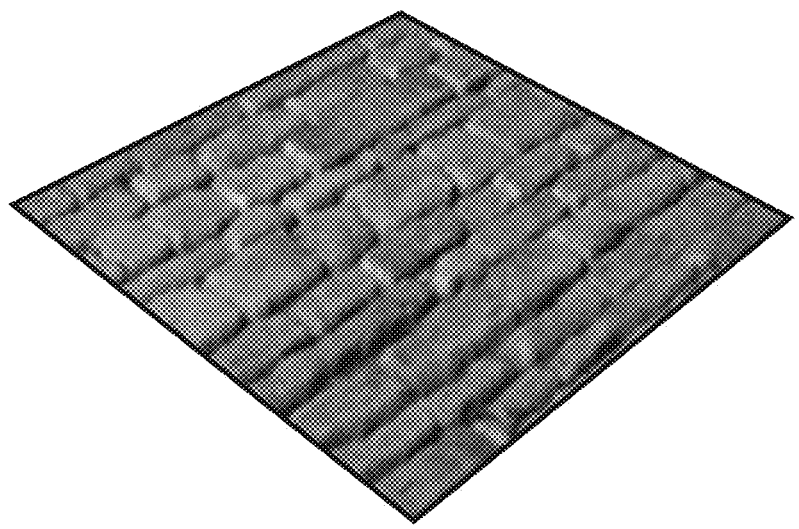
FIG. 10B illustrates the rendering of the model of FIG. 10A with a displacement map.

A displacement map is given by a greyscale image mapped onto faces of the layered model. The data in the image determines displacement of the geometry at the stage of rendering pixels. In that regard, the data is used to calculate normals per-pixel to compute lighting effects and also to calculate displacement to determine which part of the geometry will be visible to the camera for each pixel that is rendered. This can be implemented using a fragment shader in the graphics rendering pipeline that computes the appropriate data using standard techniques. An example of the effect of rendering without and with a displacement map is shown in FIGS. 10A and 10B, respectively.

Figure 11:
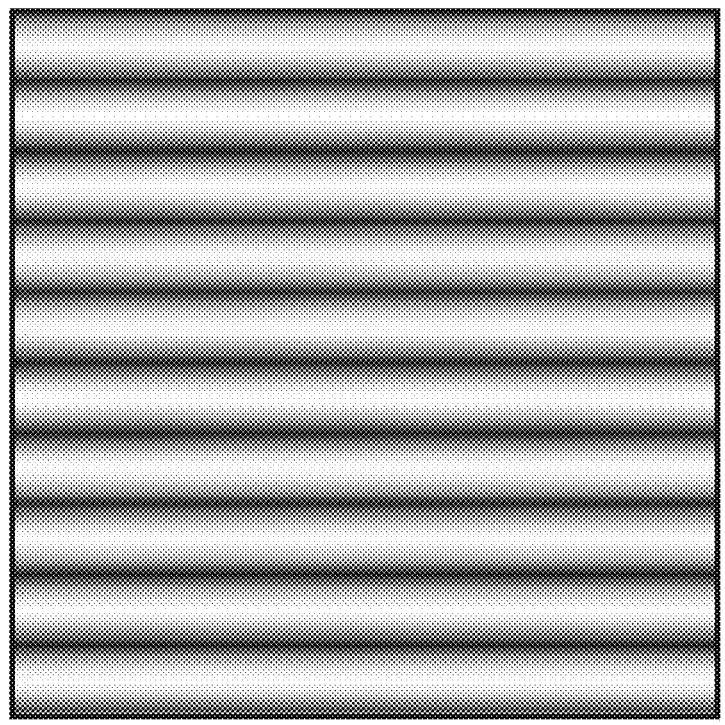
FIG. 11 illustrates a displacement map.

To generate the displacement map, the shape of the 3D printed material along a segment of a tool path is determined using the layer thickness and the feature model (e.g., representing a circular disc with a diameter equal to the diameter of the nozzle or the laser beam). The layer thickness and the feature model are determined from the configuration data. The shape of the 3D printed material is not a rectangular solid as the layered model by itself might imply. Rather, the shape of the 3D printed material is more of a rounded rectangular solid. A greyscale image encoding the displacement of the rounded portions of the segments is generated. FIG. 11 illustrates a displacement map for rendering the rounded shape of the layers when viewing the layered model from the side.

In some embodiments, noise is incorporated into the image defining the displacement map to reflect some roughness inherent in the surfaces of an object produced by a 3D printing process. The amount of noise is determined by the process type and the resolution of the 3D printer (i.e., the layer thickness and the feature model).

With continued reference to FIG. 2, in some embodiments, in order to simulate the appearance of the print material used in the 3D printing process, a material shader for the print material can be identified 60 from a library of material shaders representing the materials used in 3D printing processes. The print material can be identified from the configuration data. The identified print shader is then provided to the client-side design application 26 over the communications network 16. Alternatively, the client-side design application 26 includes the library of material shaders and identifies the material shader based on a print material parameter provided to the client-side design application 26 over the communications network 16.

A material shader is a program written for a graphics rendering pipeline to generate the visual qualities of the surface of a mesh under various lighting conditions. Numerous material shader techniques exist for emulating real world materials. Some material shaders use custom techniques for emulating a particular material, whereas others are more general techniques that take reflectance data measured from a physical material as input and can thus render a variety of materials. When visualizing the layered model, the client-side design application 26 adds the material shader to the graphics rendering pipeline.

Figure 12:
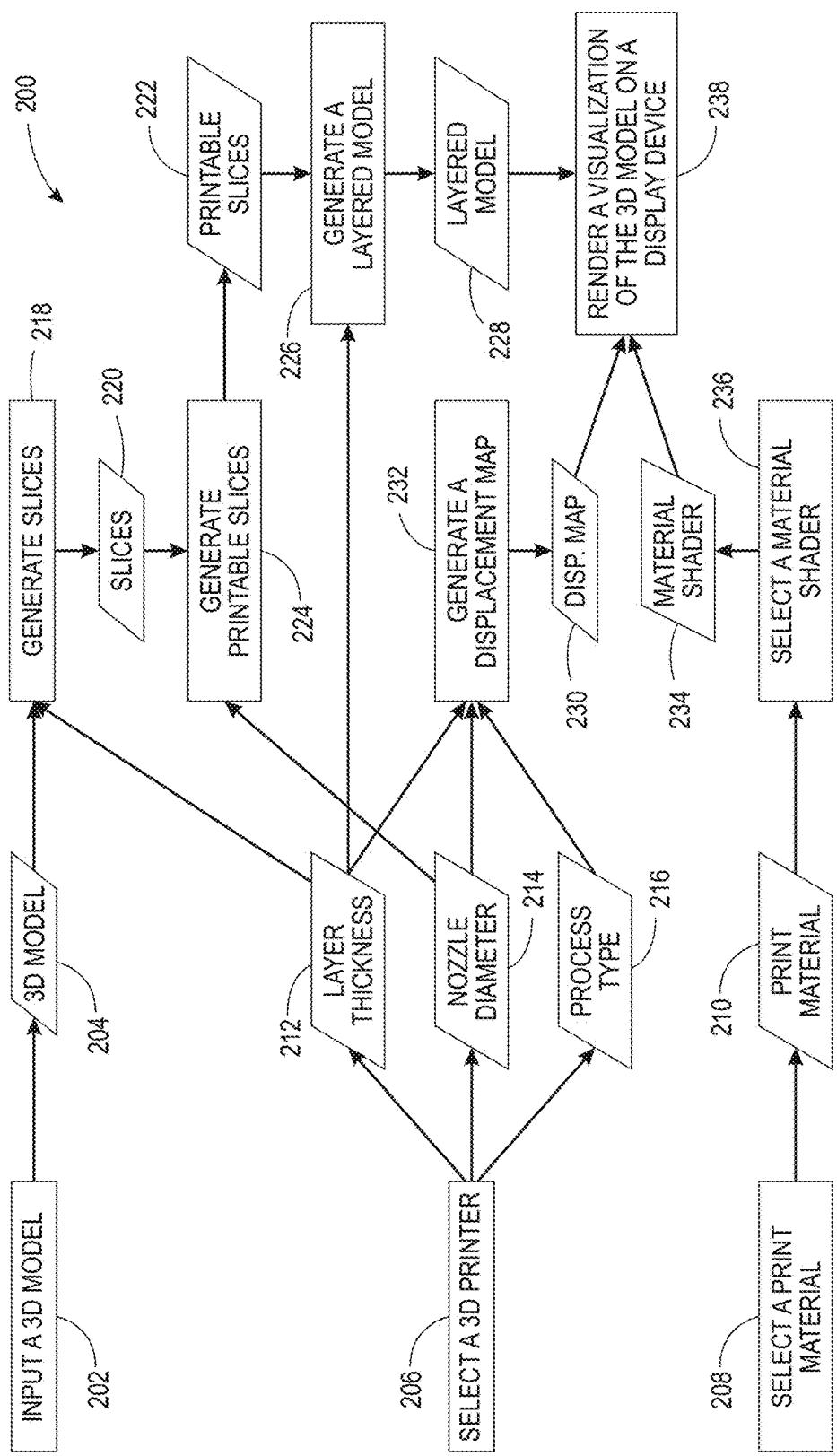
FIG. 12 illustrates a flow chart for visualizing a 3D model as it would look if printed using a 3D printing process.

With reference to FIG. 12, a flow chart 200 summarizes the above described approach for visualizing the 3D model as it would look if printed using a 3D printing process. The user inputs 202 a 3D model 204, and selects 206, 208 the print material 210 and the parameters 212, 214, 216 of the 3D printing process with the client-side design application 26. The parameters 212, 214, 216 of the 3D printing process include the process type 216 (e.g., FDM, SLS, or stereolithography (SLA)), the layer thickness 212, and the size of the smallest printable feature 214 (e.g., the nozzle or laser beam diameter). The 3D printing process parameters 212, 214, 216 can be directly selected or indirectly selected by having the user select a 3D printer from a list. Each 3D printer listed will have the parameters 212, 214, 216 preloaded for the visualization computation.

Using the input 3D model 204, and the selected print material 210 and the selected parameters 212, 214, 216 of the 3D printing process, the client-side design application 26 cooperates with the server-side design application 40 over the communications network 16 to display to the user an interactive 3D rendering of the 3D model as it would look if printed using the 3D printing process. Using a user input device 24 (e.g., a mouse), the user can interact with the 3D rendering by, for example, panning, zooming, or translating actions.

To render the 3D model 204, the server-side design application 40 generate 218 a plurality of slices 220 from the 3D model 204 by intersecting the 3D model 204 with a 2D plane parallel with the build platform for each layer of the 3D printing process. Printable slices 222 are then generated 224 from the slices 220 through simulation. The printable slices 222 reflect how the slices 220 will actually be printed. This is necessary since it may be the case that the slices 220 produced by intersecting a plane with the 3D model 204 are not replicated exactly by the tool paths generated for printing the 3D model 204.

One approach for generating a printable slice 222 is to use an existing tool path generation program and then compute the sweep of a feature model (e.g., a model of the print material extruded through the nozzle or a model of the laser) in the plane of the corresponding slice 220 along the tool path. This typically produces a shape similar to the original slice 220, but possibly differing slightly in regions of the slice polygon where corners are too sharp or features are too narrow. Another approach for generating a printable slice 222 is to employ a circular disc as a structuring element and to compute the morphological opening of the polygon of the slice 220. The opening of a polygon is computed by offsetting the polygon inward by a set distance and then back out the same distance. This process removes features that are too small to be produced by a circular disc equal to the offset distance. The opening of the polygon will have a tool path that will be accurately reproducible by the 3D printer.

According to the nomenclature above, a slice 220 is represented by the set of regions S, and a printable slice 222 is represented by the set of regions S−T. By taking the difference between a slice 220 and the corresponding printable slice 222, the set of regions T of the 3D model 204 that cannot be printed, or are printable with unpredictable results, can be identified. These regions can be used in the final rendering to give precise feedback as to how the 3D model 204 differs from the 3D model as printed. The set of printable regions S−T and the set of unprintable regions T together define a two-partition printability maps. This is to be contrasted with the three-partition printability map described above.

Having determined the printable slices 222, the printable slices 222 are each extruded by the layer thickness 212 and combined to generate 226 a layered model 228. The layered model 228 is a mesh that can be passed to a graphics rendering pipeline. Further, a displacement map 230 is generated 232 which incorporates more subtle details of the 3D printing process without the need for making a more complex mesh. Even more, a material shader 234 representing the visual appearance of the selected print material 210 is selected 236. While the layered model 228 and the displacement map 230 are generated by the server-side design application 40, the material shader 234 can be selected 236 by either the server-side design application 40 or the client-side design application 26.

The client-side design application 26 provides the layered model 228, the displacement map 230, and the selected material shader 234 to a graphics rendering pipeline of the client device 12. With this data, the graphics rendering pipeline renders 238 a visualization of the 3D model as it would look if printed with the 3D printing process to the display device 22 of the client device 12 for the user to view and interact with.

Referring back to FIG. 2, after the user views the 3D model as it would look if printed according to the 3D printing process, the user can intelligently determine 62 whether re-planning is needed. If re-planning is unnecessary the originally received 3D model can be sent to the 3D printer 17 for 3D printing. If re-planning is necessary, the user can, for example, change the configuration data, refine the 3D model, or change the build orientation (as illustrated). Having an accurate representation of a 3D model as printed can save time, money, energy, and material. A 3D model is typically iteratively printed and refined until the print of the 3D model is acceptable. This often leads to many prints that are discarded for not meeting expectations. Further, having an accurate representation of a 3D model as printed helps the user decide which print material and 3D printing process parameters should be used to print the 3D model.

Figure 13:
FIG. 13 illustrates 3D printed cats with increasing layer thickness from left to right.
Figure 14A:
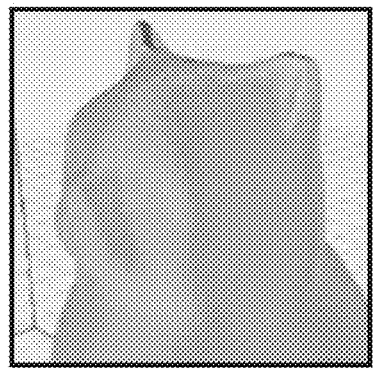
FIG. 14A illustrates the visualization of a 3D cat model with a 0.1 millimeter (mm) layer thickness.
Figure 14B:
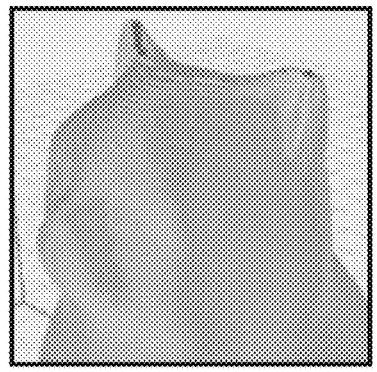
FIG. 14B illustrates the visualization of the 3D cat model of FIG. 14A with a 0.2 mm layer thickness.
Figure 14C:
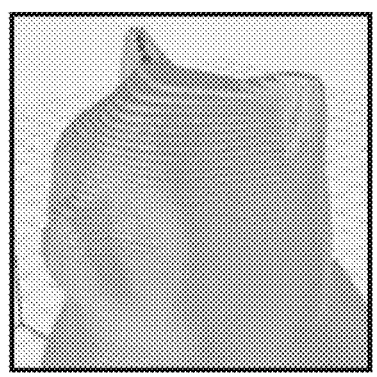
FIG. 14C illustrates the visualization of the 3D cat model of FIG. 14A with a 0.4 mm layer thickness.

With reference to FIG. 13, 3D printed cats with increasing layer thickness from left to right are illustrated. The 3D printed cats were printed from the same 3D model and with the same print material. As can be seen, the surface quality of the 3D printed cats can differ by changing the layer thickness used by the 3D printing process. A thinner layer thickness takes longer to print but produce a finer surface finish. The user, by visualizing how the layer thickness affects the printed 3D model, can make a more informed judgment based on the feedback and their requirements. In FIGS. 14A-C, the 3D model of the cat is visualized with varying layer thickness.

Referring back to FIG. 2, in addition to using the printability maps for visualizing the 3D model, the printability maps can also be used for automated metrology and model correction 64 of the 3D model. More specifically, regions in the 3D model that require modification (or redesign) for additive manufacturing are identified in each of the printability maps. These regions correspond to the weakly printable regions, the unprintable regions, or both the weakly printable and unprintable regions.

The identified regions can then be automatically modified. Several modifications are possible to ensure printability. However, one modification amounts to thickening the identified regions to retain the original form. Additionally, the identified regions can be analyzed to determine how much a local feature size of the identified regions deviate from the minimum printable feature size or the minimum recommended feature size for the print material. The modification and the analysis can each be triggered automatically in response to identifying regions in need of modification, or triggered manually in response to user input received by way of the client-side design application. As to the latter, the user can trigger the automatic modification based on the visualization of the 3D model as it would look if printed. Further, the modification and the analysis both employ the medial axis transforms of the regularized slices of the 3D model.

In some embodiments, the medial axes are computed in parallel by a plurality of processors. The plurality of processors can be distributed over a distributed computing network, including, for example, servers with multiple processor cores. In this way, the computations can be distributed across servers, and across cores per server.

A medial axis transform is a representation of a shape in terms of a lower dimensional medial axis that represents the locus of centers of maximally inscribed discs that are completely contained inside the shape. The medial axis is topologically equivalent to the shape, and the local feature size at a point x on the boundary of the shape is thus the radius of the disc that is tangent to the shape at x. Many approaches have been proposed to compute the medial axis transform, but no specific approach need be employed. Approaches range from computing distance functions on images and/or sampled representations of the shape to computations using Voronoi diagrams.

To determine how much a local feature size of the identified regions deviates from the minimum printable or recommended feature size, note that each of the identified regions includes a boundary partially overlapping with the boundary of the corresponding slice. Further, note that from the medial axis transform of a slice, the local feature size at any point on the boundary of the slice can be determined as the difference between the point and the medial axis. Hence, a local feature size of one of the identified regions can be determined from the local feature size at any point on the boundary of the slice that partially overlaps with the boundary of the identified region.

Local feature sizes of the identified regions can be displayed to the user by way of the client-side design application 26. For example, the minimum or maximum local feature size of each of the identified regions can be displayed to the user, optionally overlaid on a visualization of the 3D model or the 3D model as it would look if printed. As another example, the local feature size at any point along the boundary of the 3D model can be displayed to the user in response to selection of the point by the user with the client-side design application 26.

To automatically correct the identified regions, two approaches can be employed: global model correction; and local model correction. Regarding global model correction, a least upper bound is determined for each of the printability maps. The least upper bound for a printability map is a measure of the largest local feature size of the identified regions of the printability map that is smaller than the minimum printable or recommended feature size. The least upper bound for a printability map can be determined as the maximum local feature size of the identified regions of the printability map. The maximum local feature size of an identified region is determined as described above.

Figure 15A:
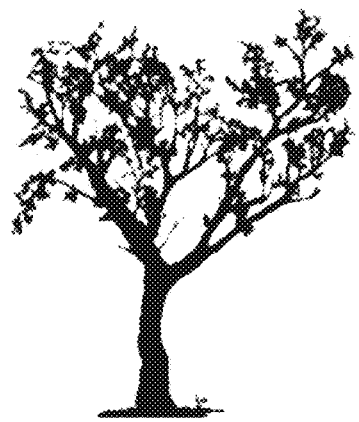
FIG. 15A illustrates a slice of a 3D model before model correction.
Figure 15B:
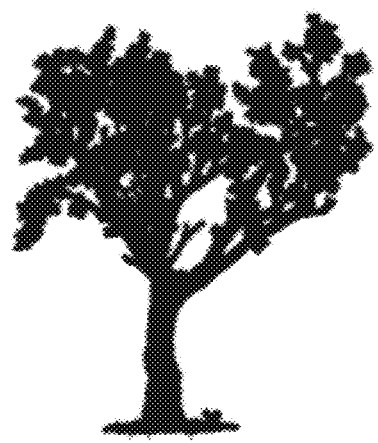
FIG. 15B illustrates the slice of FIG. 15A after global model correction.

With the least upper bounds of the printability maps, a padding value for each slice of the 3D model or the entire 3D model is determined. The padding value for a slice or the entire 3D model can be determined as the difference between the minimum printable or recommended feature size and the largest least upper bound for the slice or the entire 3D model, respectively. Using the one or more determined padding values, each slice of the 3D model is padded by the corresponding padding value. Alternatively, only the identified regions of each slice of the 3D model are padded by the corresponding padding value. The padding value for a slice describes an amount of padding to minimize the number of identified regions. FIGS. 15A and 15B illustrate a slice before and after global model correction (FIG. 15C will be discussed in connection with a following concept).

Figure 16:
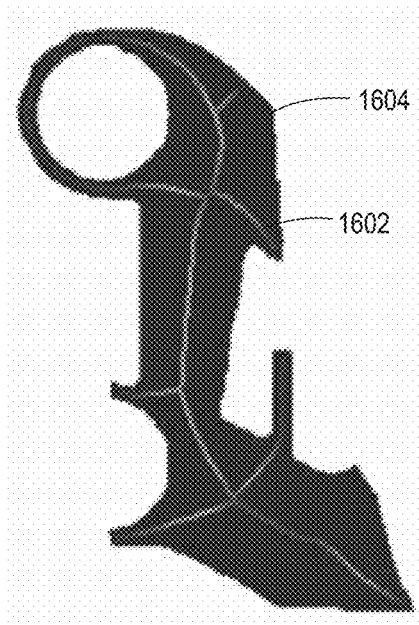
FIG. 16 illustrates a pruned medial axis of a slice.

As an alternative to global model correction, local model correction can be employed. In a simple case, local model correction includes pruning the medial axis of each slice by removing segments that contact the slice boundary. The extent of the pruning is typically minimal. FIG. 16 shows an example of a pruned medial axis 1602 of a slice 1604. Thereafter, the pruned medial axes are used to locally thicken each corresponding slice to the minimum printable or recommended feature size.

Figure 17:
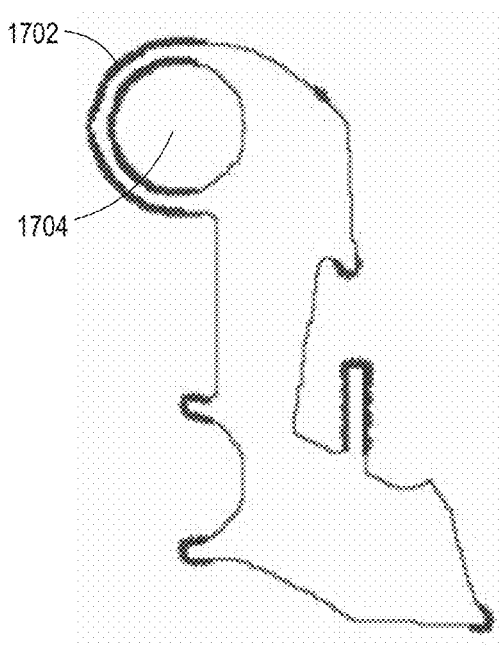
FIG. 17 illustrates local model correction at thin walls and protrusions.
Figure 18:
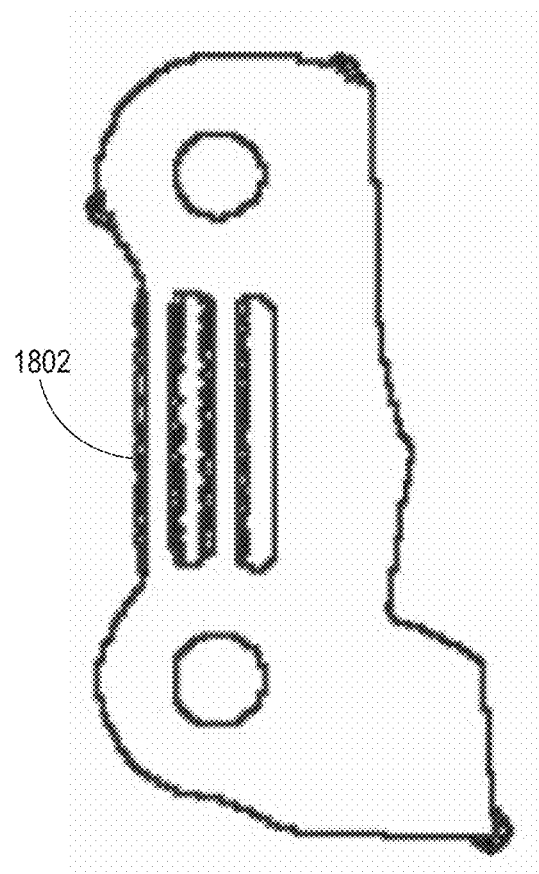
FIG. 18 illustrates local model correction at bridges.

Local thickening includes determining a corrected slice for each slice by calculating the Minkowski sum of the corresponding pruned medial axis and a structuring element representing the desired thickness. The structuring element is suitably sized to model the minimum printable or recommended feature size. Further, the structuring element is suitably a circular disc, but other shapes are contemplated. Where the structuring element is a circular disc, the Minkowski sum is preferably calculated in the polygon domain. After calculating the Minkowski sum, the Minkowski sum is merged with the slice through a union operation. FIGS. 17 and 18 show examples of the local model correction with the local thickening emphasized in black 1702, 1802.

Figure 19:
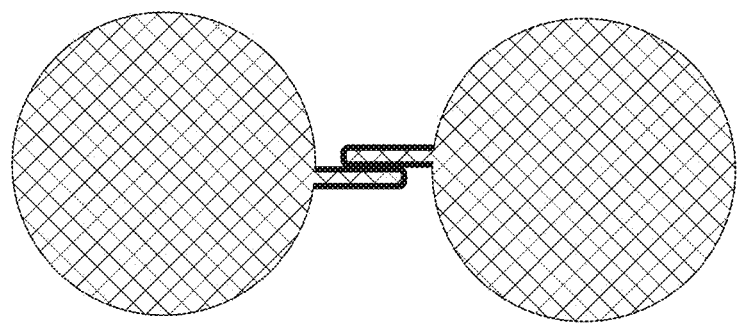
FIG. 19 illustrates a change in connectivity after local model correction.
Figure 20A:
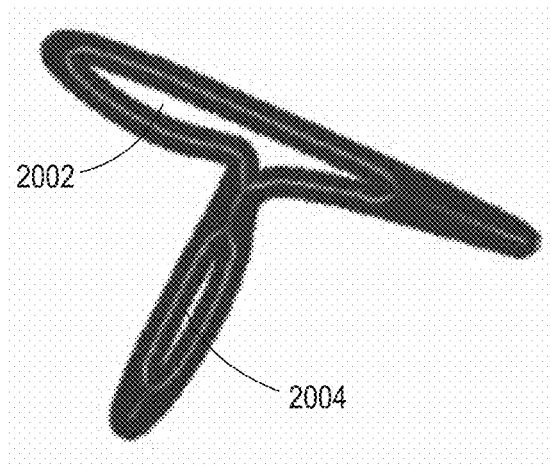
FIG. 20A illustrates a slice with the medial axis overlaid on the slice.
Figure 20B:
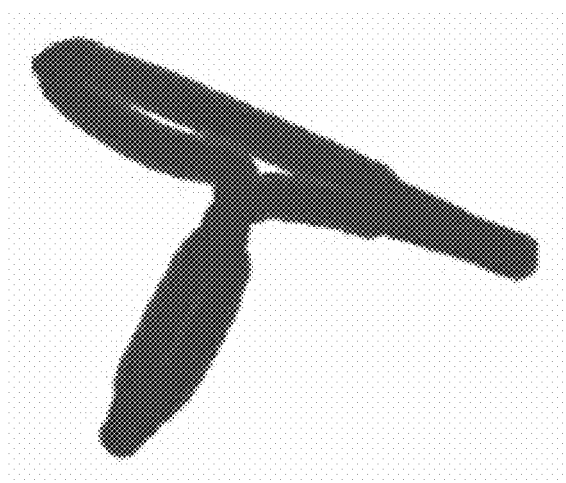
FIG. 20B illustrates the slice of FIG. 19A after local model correction.

A challenge with the foregoing approach to local model correction is that the slices are not uniformly thickened. Therefore, changes in topology and continuity at points common to the boundary of the slice before and after correction may occur. Changes in topology occur by a change in connectivity (as illustrated in FIG. 19), or a change in the number of holes. Changes in continuity occur by qualitative changes in the form of the 3D model. For example, a hole 1704 in FIG. 17 that is only partially corrected shows a change in continuity from $C^1$ to $C^0$. As another example, the change in the arrangement of holes 2002, 2004 from FIG. 20A to FIG. 20B shows a change in continuity. Changes in continuity or topology after local model correction may indicate the need for re-design.

To identify regions of a slice where changes in topology and continuity occur, note that the medial axis of a slice is the homotopy equivalent of the slice. Hence, the number of loops in the medial axis can be used to identify the number of holes in the slice before and after local model correction. Closing a hole during local model correction is equivalent to losing a loop in the medial axis, and splitting a hole during local model correction is equivalent to adding a loop in the medial axis. Further, the medial axis can be used to ensure that the local structure of holes does not change before and after local model correction.

The holes in a set X (i.e., a slice) may be described by disconnected components of the medial axis of the complement of the set $X^C$. The medial axis $M_{X^C}$ of the complement $X^C$ will be disjoint if X contains holes, because the boundary of X causes a separation of space. Among the disjoint components of $M_{X^C}$, only the closed and bounded sets are retained. In other words, only the sets with boundaries defined by the holes of X are retained. For these holes, automatic correction is locally infeasible at the bounded component $H_i$ of $X^C$ if either of two tests below is true.

The first test is whether every point in the medial axis $M_{H_i}$ of the component is inside the corrected model. This is a formal test that is true if and only if the hole $H_i$ is washed over. Intuitively, it captures the disappearance of holes whose maximum local size in $X^C$ is smaller than the differential increase in local size in X after sweeping by the structuring element. It can be implemented by checking the maximum value of the medial axis transform at $M_{H_i}$ is less than the required local feature size. The second test is whether the intersection of $M_{H_i}$ with the corrected model causes a separation of $M_{H_i}$. This test checks if a hole is split after correction.

Connectedness of a slice may also change due to local model correction. Thickening by the minimum feature size can unite disjoint components. Considering the medial axis of $X^C$, unbounded components where the medial axis transform is less than the minimum printable or recommended local feature size indicate areas that are separated before correction but will be unified after local thickening.

Figure 15C:
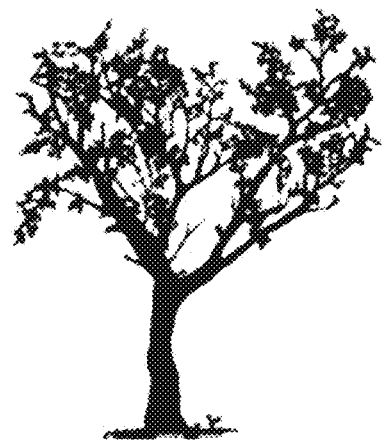
FIG. 15C illustrates the slice of FIG. 15A after local model correction.

In view of the foregoing, regions surrounding holes where local model correction is infeasible and regions where connectedness will change due to local model correction can be identified. The identified regions can then be employed to prohibit local thickening in these regions. For example, the foregoing approach to local model correction can be modified to further prune the medial axis to remove the identified regions before local thickening. An example of local model correction is shown in FIGS. 15A and 15C. FIG. 15A shows the 3D model, and FIG. 15C shows the 3D model after local model correction.

Figure 21:
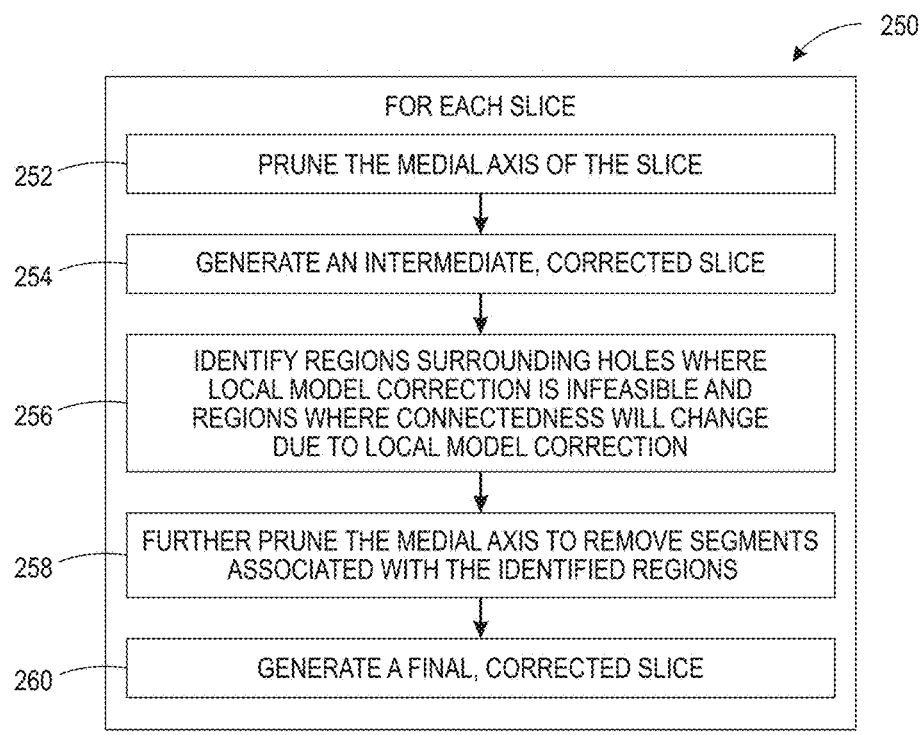
FIG. 21 illustrates a method for local model correction.

With reference to FIG. 21, a method 250 summarizes the above described approach for local model correction. According to the method 250, the medial axis of each slice of the 3D model is pruned 252 by removing segments that contact the slice boundary. The slice is then locally thickened to generate 254 an intermediate, corrected slice by calculating the Minkowski sum of the pruned medial axis and a structuring element representing the desired thickness. Both actions are performed as described above.

The intermediate, corrected slice is compared to the slice to identify 256 regions surrounding holes where local model correction is infeasible and regions where connectedness will change due to local model correction. This identification is performed in the manner described above. The pruned medial axis of the slice is then further pruned 258 to remove segments associated with the identified regions. Further, the slice is locally thickened again to generate 260 a final, corrected slice by calculating the Minkowski sum of the further pruned medial axis and the structuring element.

Referring back to FIG. 2, after correcting the slices of the 3D model by local or global model correction, the corrected 3D model can be visualized as it would look if printed. In some embodiments, those regions of the 3D model where local model correction was not performed are highlighted in the 3D model. Further, the corrected slices can be recombined into the 3D model and exported to the user by way of the client-side design application 26. The exported 3D model is suitably formatted in the same format the 3D model was received in (e.g., STEP or STL). Hence, conversion between formats may be necessary. In this way, the user can further refine the corrected 3D model using other design software, and the foregoing approaches to model correction can be employed to complement other design approaches, such as topology optimization and lattice packing, for manufacture by 3D printing.

Referring back to FIG. 1, it should be appreciated that the foregoing references to printing pertain to 3D printing. Further, it should be appreciated that the system 10 was described using a client-server model. That is to say, the system 10 included client and server devices 12, 32 communicating over a communications network 16 by way of client-side and server-side design applications 26, 40, respectfully. Those skilled in the art will appreciate that in other embodiments the functionality implemented in the server devices 32 can be integrated with the client devices 12. That is to say, the client-side and server design applications 26, 40 can be combined into a design application run on the client devices 12.

Even more, the system 10 and methods described above can be extended in multiple directions. For example, the system 10 and methods are applicable to a collection of solids manufactured together in the workspace of the printer and can be used to plan the packing of these shapes into the workspace. Topology optimization is fast emerging as a design tool that can be used to generate shapes with some optimal structural properties, and these shapes are often characterized by intertwining bridges and spikes, for which the system and methods are relevant.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

1.0 Mathematical Framework

Hereafter, a mathematical framework employed to generate a printability map is expanded upon.

1.1 Preliminaries

To characterize resolution dependent errors during 3D printing, concepts from mathematical morphology are employed. Mathematical morphology provides a set theoretic and integral formulations for analyzing geometric structures in terms of other (typically simpler) shapes and is most commonly applied in digital image processing, but has found several applications in problems as diverse as numerical control (NC) machining, topology optimization, packaging, and motion planning.

For sets A and B, note that the Minkowski sum A⊕B is:

$$A \oplus B = \bigcup_{b \in B} A + b \quad (1)$$

Further, note that the Minkowski difference A⊖B is:

$$A \ominus B = \bigcap_{b \in B} A + b \quad (2)$$

Given a regularized slice S, and a smallest feature printable by the moving head represented by a structuring element B, the restriction of the print head to the interior of the slice S implies the maximal area covered by sweeping the structuring element B inside the slice S is the morphological opening.

$$O(S, B) = (S \ominus B^{-1}) \oplus B \quad (3)$$

$$= \bigcup \{B + t: B + t \subset S, t \in \mathbb{R}^2\} \quad (4)$$

$B^{-1}$ is $U_{b \in B} -b$, and t is a planar translation. In image processing, the opening is used to filter islands that are smaller than the structuring element B and subsequently to reconstruct an approximation of the image. In 3D printing, the structuring element B represents the smallest printable feature and can be modeled as a disc that represents an infinitesimal deposition of material as a function of the nozzle diameter or laser beam width.

Openings of the regularized slice S are considered by scaling structuring element B to characterize regions that are not sufficiently large enough to hold features represented by discs of varying sizes. In particular, for positive $k_1, k_2 \in \mathbb{R}$ where $k_1 < k_2$, it follows that $O(S, k_1B) \supset O(S, k_2B)$ and there exists k where $O(S, kB) = \emptyset$. kB represents the structuring element B uniformly scaled by k.

The medial axis $M_S$ of the regularized slice S represents the locus of all points in the interior of the regularized slice S where the Euclidean distance function is non-differentiable. Geometrically, the points in the medial axis represent centers of maximally inscribed circles with radii that are given by the distance from respective centers to the boundary of the regularized slice S. Such discs will contact the boundary of the regularized slice S in at least two locations. The medial axis transform is a map $\tau: M_S \to \mathbb{R}$ defined by $\tau(x) = d(x,S)$, where d(x,S) is the Euclidean distance from a location $x \in M_S$ to points on the boundary of the regularized slice S. The value of the medial axis transform $\tau(x)$ at a location x is also called the local size.

The mapping $k \to O(S,kB)$ is sometimes called a granulometry in mathematical morphology. If the regularized slice S is defined as the union of maximally inscribed circles or 'grains' kB centered at $x \in M_S$ such that the radius of each kB is the local size $\tau(x)$, the local size can be characterized in terms of the separation of these grains through sieves of varying sizes. For example, each grain kB centered at a medial axis point with diameter greater than the diameter of the structuring element B (i.e., k>1) will not pass through the sieve determined by the size of the smallest printable feature, and is therefore larger than the smallest printable feature, and thus can be manufactured.

1.2 Defining the Printability Map

From the definitions of the morphological opening and the medial axis transform, it follows that the largest maximally inscribed circle $k_*B$ that can be placed within the boundary of the regularized slice S such that $O(S,k_*B)$ is not empty is located at the point $x_* \in S$ where the medial axis transform is maximum. This is clear by construction, because if there exists a disc with a diameter larger than this value, then $x_*$ cannot be in $M_S$. From Equation 4, it can be inferred that the ball $(k_*+\epsilon)X$ cannot be located inside the regularized slice S modulo translation. Thus, a range of scalars can be specified to define a family of openings with monotonically decreasing measure.

Figure 22:
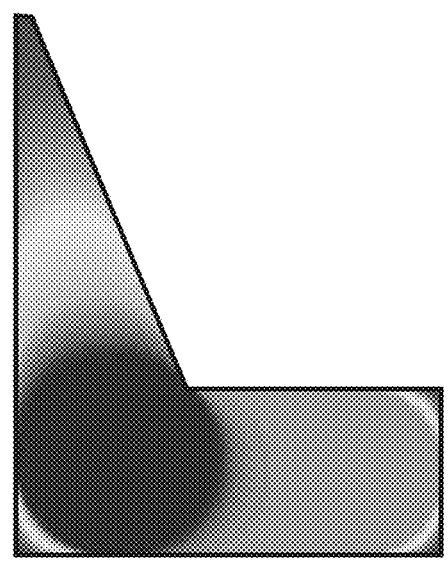
FIG. 22 illustrates a representation of a family of sets $O(S, k_2B) - O(S, k_1B)$, where $k_1 - k_2 = 1$.

With reference to FIG. 22, a representation of a family of sets $O(S, k_2B) - O(S,k_1B), k_1 - k_2 = 1$. Each distinct color represents the set that cannot be printed without scaling down the structuring element $k_1B$ to a smaller $k_2B$. The largest $k_1B$ has a radius of $\max(\tau(x)), x \in M_S$. As shown in FIG. 22, it is possible to explicitly construct the sets having measures representing the relative differences between measures of openings in the family. In particular, since the opening simulates the print process at each slice, with a specified $k, 1 < k < k_*$ it is straightforward to induce a partition of the printed slice S.

The partition, hereafter referred to as the printability map, typically includes three disjoint sets: S−O(S,B); O(S,B)−O(S, kB); and O(S,kB). S−O(S,B) represents regions that cannot be reached by the structuring element B, and therefore represents regions smaller than the smallest printable feature. Tool paths that locate the print head in these regions will result in excess material accumulation. O(S,B)−O(S, kB) represents regions reachable by the structuring element B but not by a larger structuring element kB. The radius of the structuring element kB represents the minimum recommended (local) feature size for the material used to print the part. O(S,kB) represents the subset of S that is reachable by all structuring elements larger than, and including kB. These are regions where print problems due to model size or printer resolution are not expected.

1.3 Computing Printability Maps

Using properties of the morphological opening, the printability map can be defined by moving the structuring element B and any scaled structuring elements kB along a user-defined tool path or a path filling the interior of a corresponding slice.

What is claimed is:

1. A system for visualizing three dimensional (3D) printability of a 3D model, said system comprising:
at least one processor configured to:
simulate an actual 3D printing process of the 3D model to generate a layered simulated 3D model describing the 3D model as it is to be printed, wherein operations to simulate the actual 3D printing process of the 3D model includes for the simulation, (i) selection of a printing material to be used in the actual 3D printing process and for the simulation, (ii) selection of (a) a type of 3D printing process to be used in the actual 3D printing process, (b) a thickness of layers for the actual 3D printing process, and (c) a smallest printable feature defined by one of a nozzle and a laser beam to be used in the actual 3D printing process;
generate a visual rendering of the layered simulated 3D model including highlighting of regions of the layered simulated 3D model differing from the 3D model, wherein the 3D model is an originally received model; and display the visual rendering of the layered simulated 3D model on a display device, wherein the layered 3D model is generated with unprintable regions and displayed with color coding to allow a user to identify defects in the original 3D model;
control a 3D printer to physically print the 3D model according to the layered simulated 3D model.

2. The system according to claim 1, wherein the at least one processor is further configured to:
receive or generate slices of the 3D model, the slices representing two dimensional (2D) solids of the 3D model to be printed in corresponding print layers;
simulate printing of the slices to identify corresponding printable slices; and
combine the printable slices into the layered simulated 3D model.

3. The system according to claim 2, wherein the at least one processor is further configured to:
generate one of the slices by intersecting a 2D plane with a normal parallel to a build orientation of the 3D model at a height of the corresponding print layer.

4. The system according to claim 2, wherein the simulation simulates printing of one of the slices to identify a corresponding printable slice by translating the smallest printable feature within a boundary of the slice or along a user-defined tool path, wherein the smallest printable feature is modeled with a circular disc, allowing computations to be directly formulated on polygons that define the boundary of the slice.

5. The system according to claim 2, wherein the simulation simulates printing of one of the slices to identify a corresponding printable slice by calculating a morphological opening of the slice by a structuring element representing the smallest printable feature.

6. The system according to claim 2, wherein the combining includes:
extruding the printable slices in a print direction by a distance equal to layer thickness of 3D printing process; and
placing the extruded printable slices in the layered simulated 3D model at heights of the corresponding print layers.

7. The system according to claim 1, wherein the at least one processor is further configured to:
generate a displacement map, as part of the simulation of the actual 3D printing process, mapped to a surface of the layered simulated 3D model from a shape of a segment of 3D printed material generated according to the 3D printing process, wherein the displacement map is given by an image, data in the image determining displacement geometry at a stage of rendering pixels, and the data being used to calculate normals per-pixel to compute lighting effects and to calculate displacement to determine which part of the geometry will be visible to a camera for each pixel that is rendered, wherein noise is incorporated into an image defining the displacement map, an amount of the noise incorporated being determined to reflect roughness inherent in surfaces of an object produced by the actual 3D printing process; and
generate the visual rendering with the displacement map.

8. The system according to claim 1, wherein the at least one processor is further configured to:
select a material shader for a print material selected by a user; and
generate the visual rendering with the material shader.

9. The system according to claim 1, wherein the at least one processor is further configured to:
receive or generate slices of the 3D model, the slices representing two dimensional (2D) solids of the 3D model to be printed in corresponding print layers;
simulate printing of the slices to identify corresponding printability maps, the printability maps partitioning the slices into at least two sets of disjoint regions, the at least two sets of regions including a set of regions formed of features smaller than a minimum printable feature and a set of regions formed of features larger than the minimum printable feature;
combine the printability maps into the layered simulated 3D model; and
generate a visual rendering of the layered simulated 3D model in which the at least two sets of regions are displayed differently.

10. The system according to claim 1, wherein the at least one processor includes a plurality of processors, and wherein the plurality of processors are configured to simultaneously simulate printing of multiple layers of the 3D model in parallel to generate the layered simulated 3D model.

11. A method for visualizing three dimensional (3D) printability of a 3D model, said method comprising:
simulating by at least one processor an actual 3D printing process of the 3D model to generate a layered simulation 3D model describing the 3D model as it is to be printed, wherein operations to simulate the actual 3D printing process of the 3D model includes, for the simulation, (i) selection of a printing material to be used in the actual 3D printing process and, for the simulation, (ii) selection of (a) a type of actual 3D printing process to be used in the actual 3D printing process, (b) a thickness of layers of the actual printing process in the actual 3D printing process, and (c) a smallest printable feature defined by one of a nozzle and a laser beam to be used in the actual 3D printing process for the simulation;
generating by the at least one processor a visual rendering of the layered simulated 3D model including highlighting of regions of the layered simulated 3D model differing from the 3D model, wherein the 3D model is an originally received model; and
displaying by the at least one processor the visual rendering of the layered 3D model on a display device, wherein the layered 3D model is generated with unprintable regions and displayed with color coding to allow a user to identify defects in the original 3D model;
controlling a 3D printer to physically print the 3D model according to the layered simulated 3D model.

12. The method according to claim 11, further including receiving or generating slices of the 3D model, the slices representing two dimensional (2D) solids of the 3D model to be printed in corresponding print layers;
simulating printing of the slices to identify corresponding printable slices; and
combining the printable slices into the layered simulated 3D model.

13. The method according to claim 12, further including:
generating one of the slices by intersecting a 2D plane with a normal parallel to a build orientation of the 3D model at a height of the corresponding print layer.

14. The method according to claim 12, wherein the simulation simulates printing of one of the slices to identify a corresponding printable slice by translating the smallest printable feature within a boundary of the slice or along a user-defined tool path and wherein the smallest printable feature is modeled with a circular disc, allowing computations to be directly formulated on polygons that define the boundary of the slice.

15. The method according to claim 12, wherein the simulation simulates printing of one of the slices to identify a corresponding printable slice by calculating a morphological opening of the slice by a structuring element representing the smallest printable feature.

16. The method according to claim 12, wherein the combining includes:
   extruding the printable slices in a print direction by a distances equal to layer thickness of 3D printing process; and
   placing the extruded printable slices in the layered simulated 3D model at heights of the corresponding print layers.

17. The method according to claim 11, further including:
   generating a displacement map mapped to a surface of the layered 3D model from a shape of a segment of 3D printed material generated according to the 3D printing process, wherein noise is incorporated into an image defining the displacement map, an amount of the noise incorporated being determined to reflect roughness inherent in surfaces of an object produced by the actual 3D printing process; and
   generating the visual rendering with the displacement map.

18. The method according to claim 11, further including:
   selecting a material shader for a print material selected by a user; and
   generating the visual rendering with the material shader.

19. A system for visualizing three dimensional (3D) printability of a 3D model, said system comprising:
   at least one processor configured to:
      simulate an actual 3D printing process of the 3D model to generate a layered simulated 3D model describing the 3D model as it is to be printed, wherein operations to simulate the actual 3D printing process of the 3D model includes for the simulation, (i) selection of a printing material to be used in the actual 3D printing process and for the simulation, (ii) selection of (a) a type of 3D printing process to be used in the actual 3D printing process, (b) a thickness of layers for the actual 3D printing process, and (c) a smallest printable feature model defined by one of a nozzle and a laser beam to be used in the actual 3D printing process;
      select a material shader for a print material selected by a user;
      generate a displacement map as part of the simulation of the 3D printing process mapped to a surface of the layered 3D model from a shape of a segment of 3D printed material generated according to the 3D printing process, wherein the displacement map is given by a greyscale image, data in the greyscale image determining displacement geometry at a stage of rendering pixels, and the data being used to calculate normals per-pixel to compute lighting effects and to calculate displacement to determine which part of the geometry will be visible to a camera for each pixel that is rendered;
      generate a visual rendering of the layered 3D model with the displacement map and the material shader including highlighting of regions of the layered 3D model differing from the 3D model, wherein the 3D model is an originally received model; and
      display the visual rendering of the layered 3D model on a display device, wherein the layered 3D model is generated with unprintable regions and displayed with color coding to allow a user to identify defects in the original 3D model;
      control a 3D printer to physically print the 3D model according to the layered simulated 3D model.

20. The system according to claim 7, wherein the image which gives the displacement map is a greyscale image.

* * * * *